(12) United States Patent
Takenaka et al.

(10) Patent No.: US 6,853,256 B2
(45) Date of Patent: Feb. 8, 2005

(54) VOLTAGE CONTROLLED OSCILLATOR WITH REFERENCE CURRENT GENERATOR

(75) Inventors: Kyoichi Takenaka, Yokohama (JP); Akihiko Yoshizawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 32 days.

(21) Appl. No.: 10/340,733

(22) Filed: Jan. 13, 2003

(65) Prior Publication Data

US 2003/0132806 A1 Jul. 17, 2003

(30) Foreign Application Priority Data

Jan. 16, 2002 (JP) ........................................ 2002-008052

(51) Int. Cl.[7] ................................................ H03B 5/24
(52) U.S. Cl. ...................... 331/17; 331/34; 331/177 R
(58) Field of Search ........................ 331/17, 34, 177 R, 331/16, 2, 57, 185; 327/156

(56) References Cited

U.S. PATENT DOCUMENTS

| 5,412,349 A | * | 5/1995 | Young et al. ................. 331/34 |
| 5,619,170 A | * | 4/1997 | Nakamura ................... 331/1 A |
| 5,635,878 A | * | 6/1997 | Liu et al. ...................... 331/57 |
| 5,900,784 A | | 5/1999 | O'Sullivan |
| 6,011,444 A | | 1/2000 | Takada et al. |
| 6,225,868 B1 | | 5/2001 | Kawaguchi |
| 6,323,738 B1 | | 11/2001 | Yoshizawa et al. |

FOREIGN PATENT DOCUMENTS

| JP | 07-007328 | 1/1995 |
| JP | 08-063892 | 3/1996 |
| JP | 10-084278 | 3/1998 |
| JP | 11-088162 | 3/1999 |
| JP | 11-168378 | 6/1999 |
| JP | 11-298320 | 10/1999 |
| JP | 2000-252819 | 9/2000 |

\* cited by examiner

*Primary Examiner*—Robert Pascal
*Assistant Examiner*—Joseph Chang
(74) *Attorney, Agent, or Firm*—Oblon, Spivak, McClelland, Maier & Neustadt, P.C.

(57) ABSTRACT

A first current controlled oscillator outputs an oscillation signal of a first frequency equal to a product of a first control current and a first gain. A first voltage/current converting circuit outputs a first output current equal to a product of a second gain and a voltage difference between a first control voltage and a first reference voltage. A first reference current generator outputs a constant current. A control current circuit outputs a second output current variable. An adder sets the first control current to a sum of the first output current, the constant current and the second output current.

16 Claims, 16 Drawing Sheets

US 6,853,256 B2

VOLTAGE CONTROLLED OSCILLATOR WITH REFERENCE CURRENT GENERATOR

CROSS REFERENCE TO RELATED APPLICATIONS

This application is based upon and claims the benefit of priority from the prior Japanese Patent Applications No. P2002-8052; filed on Jan. 16, 2002; the entire contents of which are incorporated herein by reference.

BACKGROUND OF THE INVENTION

The present invention relates to a voltage controlled oscillator (VCO) having a wide-band oscillation frequency range. In particular, the invention relates to a VCO which suppresses influences of disturbance and noise.

The VCO is provided in a phase locked loop (PLL) circuit and used for a semiconductor device. An oscillation signal outputted from the PLL circuit is supplied to circuit blocks inside and outside the semiconductor device as a clock signal.

The VCO affects the accuracy and stability of oscillation characteristics of the oscillation signal of the PLL circuit. In the VCO, the characteristics of output oscillation frequency to an input voltage changes depending on of disparity of the manufacturing process of the semiconductor device, temperature of the operating environment, deflection of power supply voltage and the like. In recent years, semiconductor devices are required to have a wide-band oscillation frequency range. To satisfy this demand, oscillation frequency gain of the VCO to an input voltage needs to be increased in order to achieve a wide-band oscillation frequency range. However, there is a problem that when this oscillation frequency gain is increased, a change of the output oscillation frequency is increased due to a disturbance.

BRIEF SUMMARY OF THE INVENTION

A voltage controlled oscillator according to embodiments of the present invention includes a first current controlled oscillator configured to output an oscillation signal of a first frequency equal to a product of a first control current and a first gain, a first voltage/current converting circuit configured to output a first output current equal to a product of a second gain and a voltage difference between a first control voltage and a first reference voltage, a first reference current generator configured to output a constant current, a control current circuit configured to output a second variable output current, and an adder configured to set the first control current to a sum of the first output current, the constant current and the second output current.

A phase locked loop circuit is configured to input a clock signal having a reference frequency according to embodiments of the present invention and includes a first current controlled oscillator configured to output an oscillation signal of a first frequency equal to a product of a first control current and a first gain, a first voltage/current converting circuit configured to output a first output current equal to a product of a second gain and a voltage difference between a first control voltage and a first reference voltage, a first reference current generator configured to output a constant current, a control current circuit configured to output a second variable output current, an adder configured to set the first control current to a sum of the first output current, the constant current and the second output current, a divider configured to divide the first frequency, a frequency/phase comparator configured to receive a frequency difference of the reference frequency and the first divided frequency, a charge pump configured to output a third output current corresponding to the frequency difference, and a loop filter configured to output the first control voltage proportional to an integrated value of the third output current.

A phase locked loop circuit is configured to input a clock signal having a reference frequency according to embodiments of the present invention and includes a first current controlled oscillator configured to output an oscillation signal of a first frequency equal to a product of a first control current and a first gain, a first voltage/current converting circuit configured to add a first output current equal to a product of a second gain and a voltage difference between a first control voltage and a first reference voltage to the first control current, a second voltage/current converting circuit configured to output a second output current equal to a product of a voltage difference between a second control voltage and a first reference voltage and a third gain larger than the second gain, a second current controlled oscillator configured to output an oscillation signal of a second frequency equal to a product of a second control current and the first gain, a third voltage/current converting circuit configured to add a third output current equal to a product of a fourth gain and a voltage difference between a third control voltage and a third reference voltage to the second control current, a fourth voltage/current converting circuit configured to add a fourth output current equal to a product of the fourth gain and a voltage difference between the third control voltage and the third reference voltage to the first control current, a divider configured to divide the second frequency, a frequency/phase comparator configured to receive a frequency difference between the second frequency divided and the reference frequency, a charge pump configured to output a fifth output current corresponding to the frequency difference, and a loop filter configured to output the third control voltage proportional to an integrated value of the fifth output current.

DETAILED DESCRIPTION OF THE INVENTION

Figure 1A:
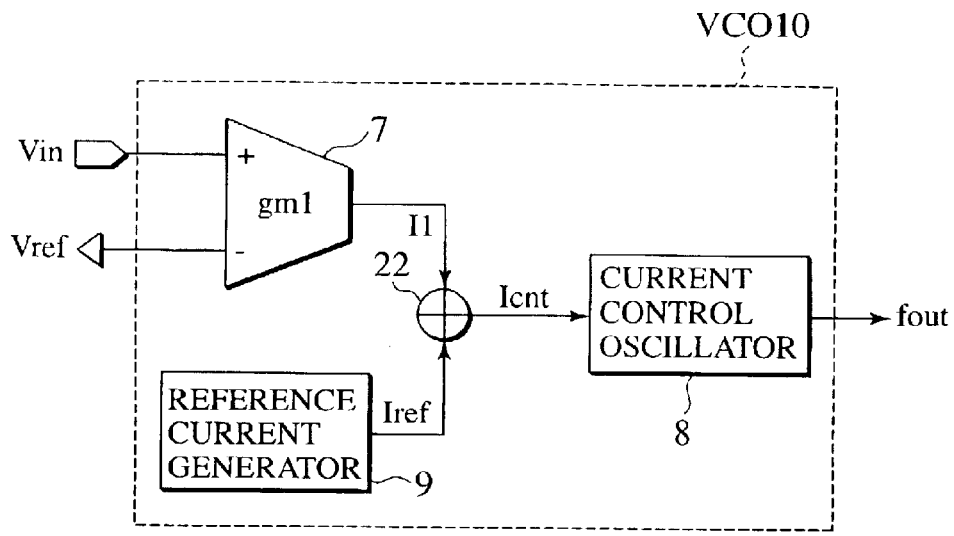
FIG. 1A is a block diagram of a basic VCO.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(Basic VCO)

The basic VCO has a voltage/current converting circuit 7, a reference current generator 9, an adder 22 and a current controlled oscillator 8 as shown in FIG. 1A. The voltage/current converting circuit 7 outputs a current I1 proportional to a voltage difference between input voltage Vin and reference voltage Vref. The reference current generator 9 outputs a reference current Iref. The adder 22 sums up the current I1 and the reference current Iref and then, outputs a control current Icnt, which is a sum of the current I1 and the reference current Iref. The current controlled oscillator 8 outputs an output oscillation frequency fout proportional to the control current Icnt.

Figure 1B:
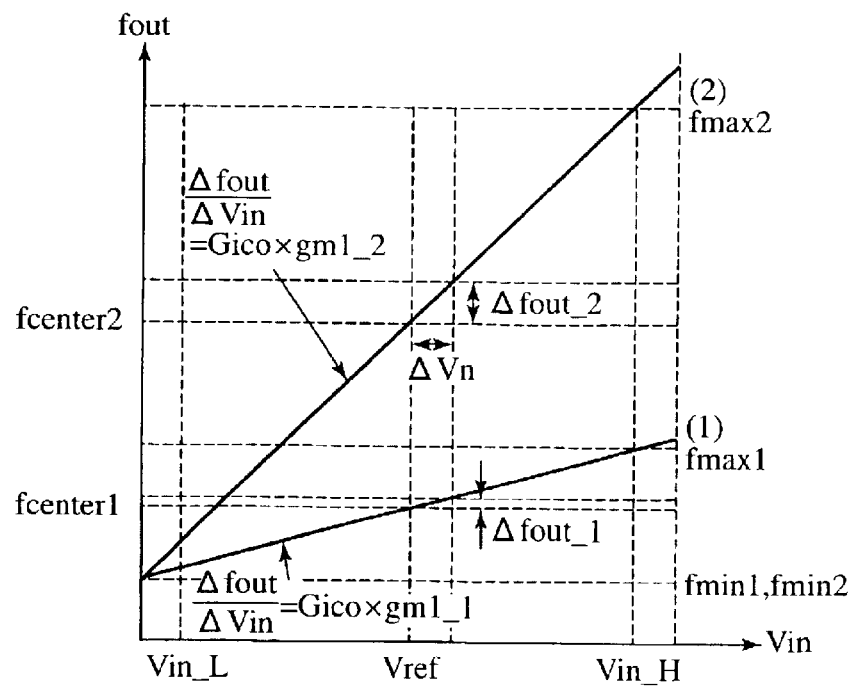
FIG. 1B is a graph of output frequency to input voltage of the basic VCO.

A PLL circuit with the basic VCO 10 cannot convert oscillation frequency fout to a wide-band while maintaining jitter characteristic and loop characteristic. Hereinafter, conversion to the wide-band will be described with reference to FIG. 1B.

First, as for the oscillation characteristic (1) of the output oscillation frequency fout to the input voltage Vin before conversion of the VCO circuit to wide-band, when the input voltage Vin is equal to the reference voltage Vref (Vin=Vref), the output oscillation frequency fout outputs an intermediate frequency fcenter1 (fout=fcenter1). Current gain gm1 of the voltage/current converting circuit 7 before conversion to wide band is gm1_1.

Next, as for the oscillation characteristic (2) of the output oscillation frequency fout to the input voltage Vin after conversion of the VCO circuit wide-band, when the input voltage Vin is equal to the reference voltage Vref (Vin=Vref), the output oscillation frequency fout outputs an intermediate frequency fcenter2 (fout=fcenter2). Current gain gm1 of the voltage/current converting circuit 7 after conversion to wide band is gm1_2.

To convert the oscillation frequency fout to wide band from the oscillation characteristic (1) to the oscillation characteristic (2), first, the reference current Iref of the reference current generator 9 is increased. Consequently, the intermediate frequency increases from fcenter1 to fcenter2. Next, the current gain gm1 of the voltage/current converting circuit 7 is changed from gm1_1 to gm1_2 which is larger than gm1_1. When the current gain gm1 is increased, the oscillation frequency range can be extended.

Assume that a disturbance $\Delta$Vn is mixed into each input voltage Vin of the VCO circuit based on the oscillation characteristic (1) before the conversion to wide-band and the input voltage Vin of the VCO circuit based on the oscillation characteristic (2) after the conversion to wide-band. When changes $\Delta$fout of the oscillation frequencies fout of the VCO circuits based on the oscillation characteristic (1), (2) are $\Delta$fout1, $\Delta$fout2, $\Delta$fout1 and $\Delta$fout2 can be expressed by the following equations 1.

$$\Delta f_{out\_1} = gm_{1\_1} \times G_{ico} \times \Delta V_n$$

$$\Delta f_{out\_2} = gm_{1\_2} \times G_{ico} \times \Delta V_n \quad (1)$$

Here, Gico is current frequency conversion gain of the current controlled oscillator 8. Even when the disturbance $\Delta$Vn of the same magnitude is mixed in an input terminal Vin of the VCO circuit, the frequency change $\Delta$fout2 of the oscillation characteristic (2) is larger than the frequency change $\Delta$fout1 of the oscillation characteristic (1) because of the relation of gm1_1<gm 2_2 and equations 1. That is, when the value of the current gain gm1 of the voltage/current converting circuit 7 is increased to extend the oscillation frequency range, influence of the disturbance $\Delta$Vn to the oscillation frequency fout is intensified. Originally, since the change $\Delta$fout (jitter) of the oscillation frequency fout to the disturbance $\Delta$Vn deteriorates the accuracy of an output clock, it is preferable to minimize the change of $\Delta$fout.

The PLL circuit using the VCO 10 has a problem that its loop band is changed when the current gain gm1 has been changed. The loop band is calculated depending on the oscillation frequency gain, dividing ratio, phase comparator gain, loop filter characteristic and the like. The loop band is a parameter which affects such important characteristics as the accuracy of the output oscillation of the PLL circuit and operation characteristic (drawing action) when the oscillation frequency is switched. Because this is originally designed to be an optimum value, it is not preferable to change this value. However, the oscillation frequency range cannot be changed unless the value of the current gain gm1 is changed. Thus, it is not only necessary to change the value of the current gain gm1 but also adjust the dividing ratio of other block constituting the PLL circuit, the phase comparator gain, loop filter characteristic and the like so as to recalculate the loop band.

In view of the above-described operational functions, it is necessary to achieve a VCO circuit having a wide oscillation frequency range without increasing the current gain gm1 of the VCO circuit or increasing the oscillation frequency gain.

In the following embodiments, a VCO circuit is provided which has a stabilized oscillation characteristic with respect to changes of the operating environment, such as power supply voltage and temperature, and which has a wide oscillation frequency range without increasing the oscillation frequency gain.

(First Embodiment)

A semiconductor device 31 of a first embodiment includes PLL1–PLL5, a reference clock 2, drivers 1–4, an operating unit CPU, memories 1–3, input devices 1, 2, and output devices 1, 2. A semiconductor integrated circuit 1 of the first embodiment includes PLL1–PLL5, a reference clock 2, drivers 1–4, an operating unit CPU, and a memory 3. The semiconductor integrated circuit 1 is connected to the reference clock 2. The reference clock 2 outputs a clock signal CK0 of input frequency fin. The PLL1–PLL5 inputs the clock signal CK0. The reference clock 2 is preferred to be a crystal oscillator.

The PLL1 outputs the clock signal CK1 of the output frequency fout1 to circuit blocks such as the operating unit CPU and DSP. After receiving an input of the clock signal CK1, the operating unit CPU and the like carries out arithmetic operations. The operating unit CPU and the like output control signals E1–5 for controlling the output frequencies fout1, fout6, fout3–5. The PLL1 changes the output oscillation frequency fout based on the control signal E1. The CPU is capable of changing its operation speed by changing the output oscillation frequency fout1.

The PLL 2 outputs the clock signal CK2 of the output frequency fout6 to a memory read-out driver 1 based on a control signal E2. After receiving an input of the clock signal CK2, the driver 1 reads out data D or the like from the memories 1, 3. In this reading operation, reading speed differs depending on the kind of data D to be handled, the memory medium, memory operating performance and the like. For example when the data D is animation, the reading speed is high. When the memories 1–3 are switched for use, the driver 1 changes the reading speed depending on the operating performance of each of the memories 1–3. The reading speed has correlation with the output frequency fout 6 of the PLL 2. The output frequency fout 6 changes depending on the reading speed based on the control signal E2. For the memories 1–3, CDROM, DVD, DRAM, non-volatile memory or the like is used.

The PLL3 outputs a clock signal CK3 of output frequency fout3 to a memory writing driver 2. After receiving an input of the clock signal CK3, the driver 2 writes data D or the like into the memories 1, 3. The output frequency fout3 of the PLL3 changes based on the control signal E3 depending on writing speed of the output frequency fout3.

The PLL4 outputs a clock signal CK4 of output frequency fout4 to an input driver 3 based on control signal E4. After receiving an input of the clock signal CK4, the driver 3 inputs an input of the data D from the input devices 1, 2. The output frequency of the PLL4 also changes based on control signal E4 depending on input speed.

The PLL5 outputs a clock signal CK5 of output frequency fout5 to an output driver 4 based on control signal E5. After receiving an input of the clock signal CK5, the driver 4 outputs the data D and the like through output devices 1, 2. The output frequency fout5 of the PLL5 changes based on a control signal E5 depending on the output speed.

(PLL Circuit of the First Embodiment)

Figure 2:
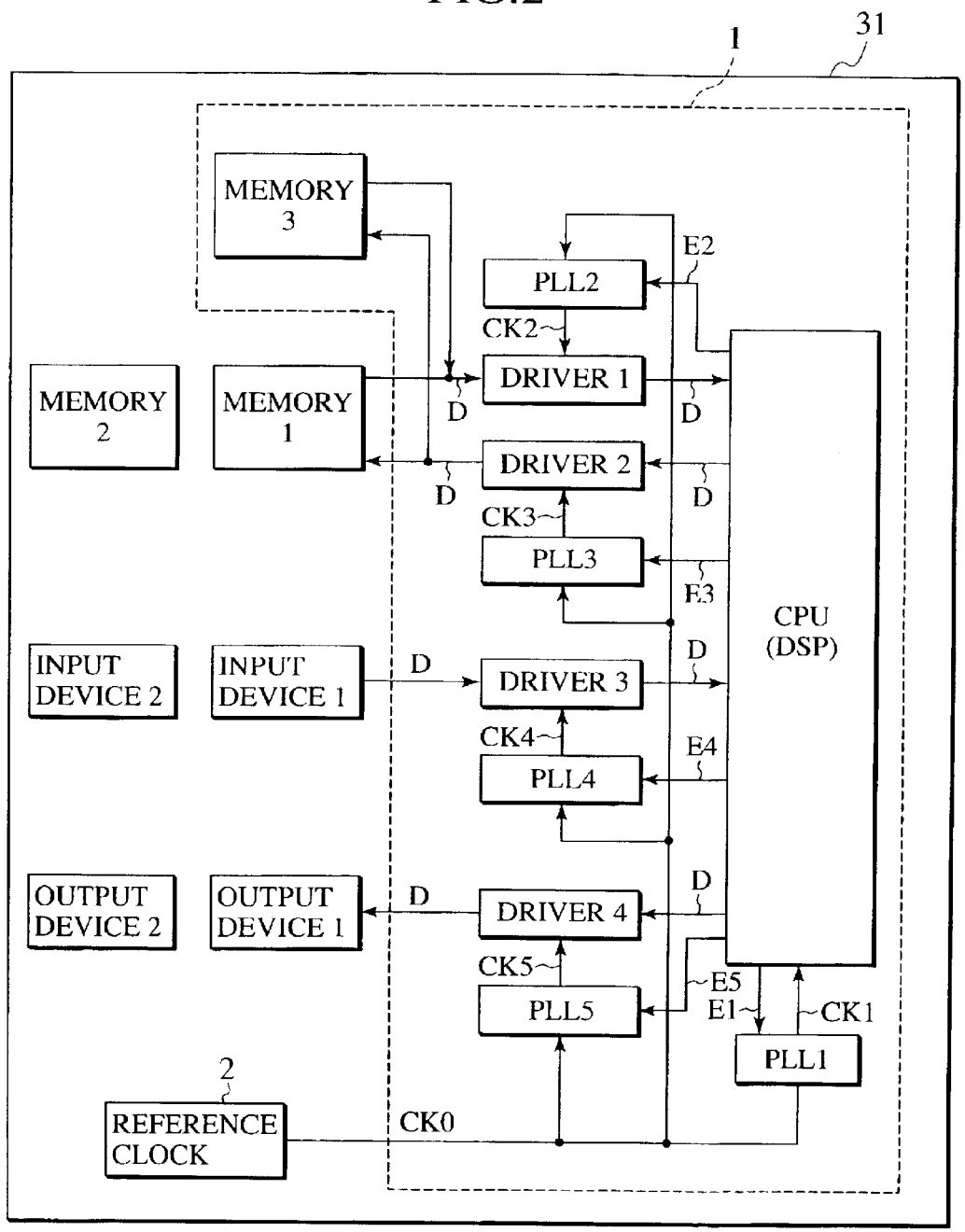
FIG. 2 is a block diagram of a semiconductor device according to the first embodiment.
Figure 3A:
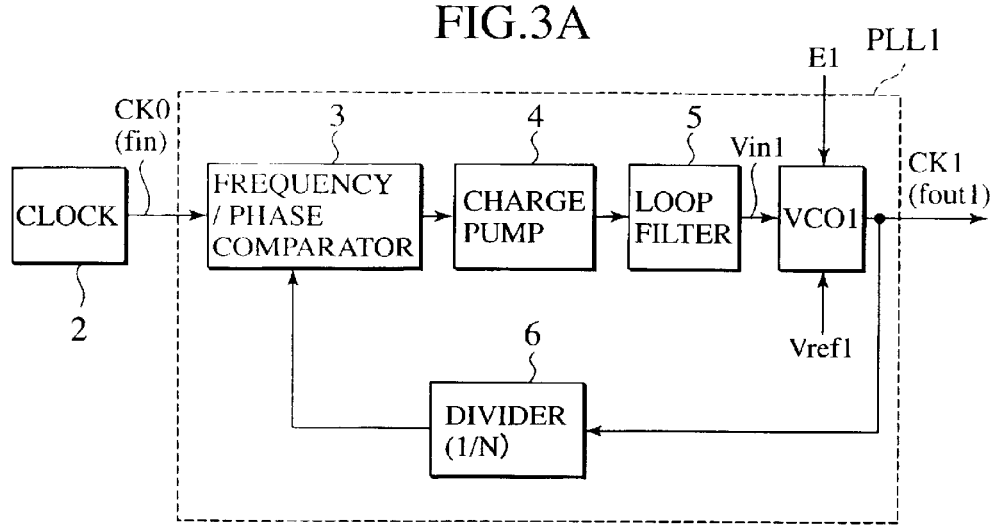
FIG. 3A is a block diagram of a PLL circuit according to the first embodiment.

As shown in FIG. 3A, the PLL1 of a first embodiment receives inputs of the control signal E1 and a clock signal CK0 of input frequency fin and outputs the clock signal CK1 of the output frequency fout1. The PLL1 includes a frequency/phase comparator 3, a charge pump 4, a loop filter 5, a VCO circuit VCO1, and a divider 6. The PLL2–PLL5 shown in FIG. 2 have the same structure as the PLL1.

The divider 6 divides the output frequency fout1 by N. The divider 6 outputs an oscillation signal 1/N the output frequency fout1.

The frequency/phase comparator 3 compares the frequency of an oscillation signal outputted by the divider 6 with the input frequency fin which is the reference frequency. The frequency/phase comparator 3 outputs a difference between the phase of output frequency of the divider 6 and the phase of the input oscillation frequency fin or an error output proportional to this difference.

The charge pump 4 outputs a current proportional to the error output.

The loop filter 5 integrates currents outputted by the charge pump 4. The loop filter 5 outputs Vin1 proportional to a current value gained by the integration.

The VCO1 outputs the clock signal CK1 of the output frequency fout1 proportional to a difference between the input voltage Vin1 and the reference voltage Vref1. Further, the VCO 1 changes the output oscillation frequency fout1 of the clock signal CK1 corresponding to the control signal E1.

Consequently, the PLL 1 can output an oscillation signal whose output frequency fout1 is N times the input frequency fin stably.

(VCO Circuit of the First Embodiment)

Figure 3B:
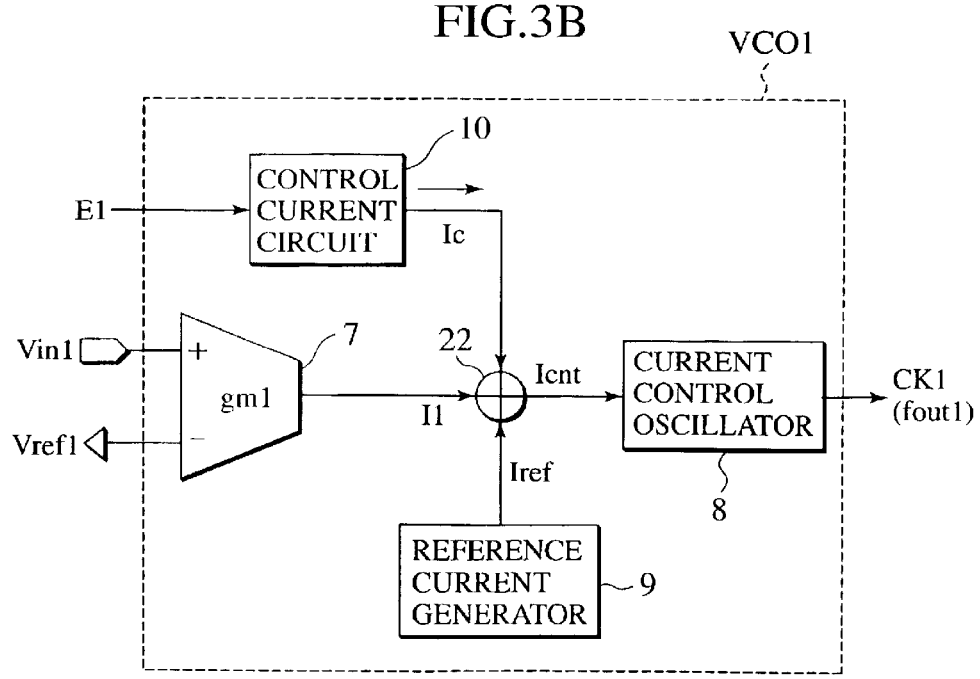
FIG. 3B is a block diagram of a VCO according to the first embodiment.

As shown in FIGS. 3A, 3B, the VCO1 of the first embodiment receives inputs of the input voltage Vin1, the reference voltage Vref1 and the control signal E1 so as to output an oscillation signal of the output oscillation frequency fout1. The VCO1 includes the voltage/current converting circuit 7, the reference current generator 9, a control current circuit 10, the current controlled oscillator 8 and the adder 22.

(Voltage/Current Converting Circuit of the First Embodiment)

Figure 4:
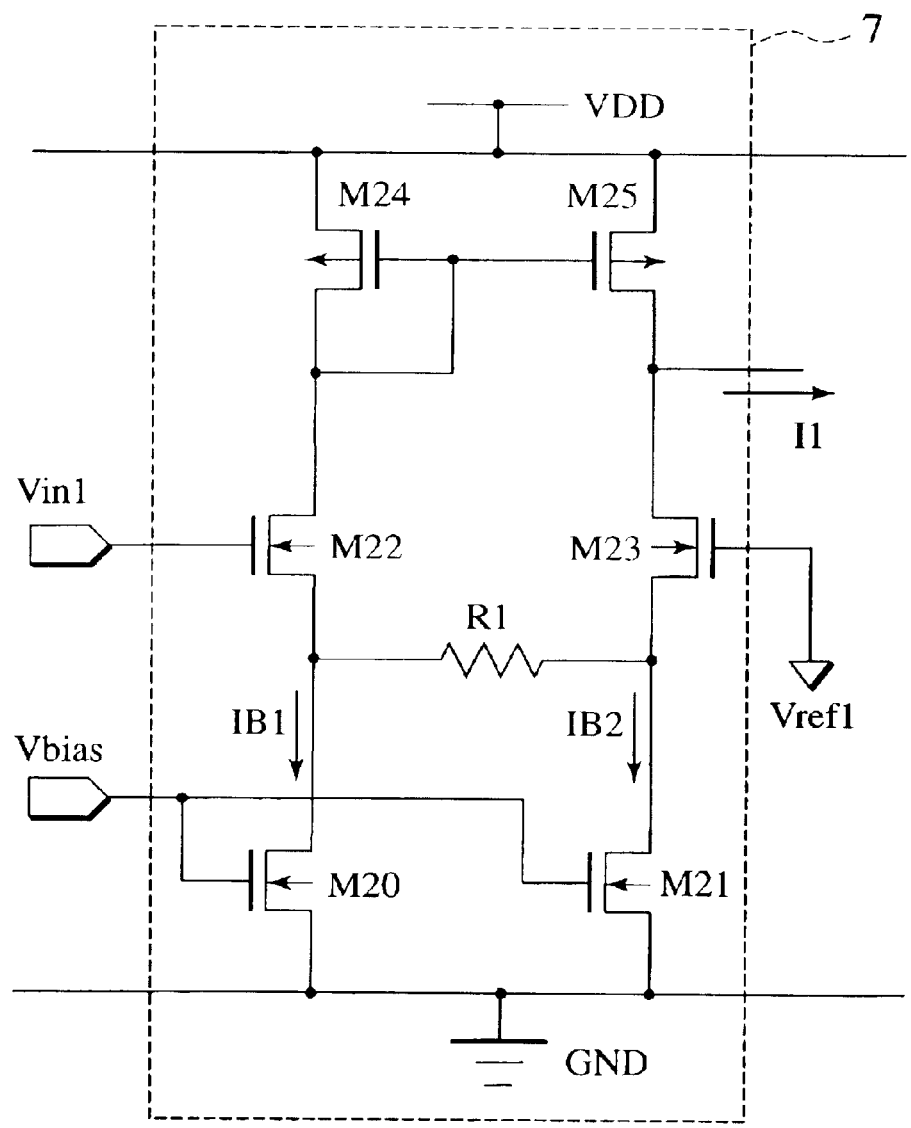
FIG. 4 is a circuit diagram of a voltage/current converting circuit.

As shown in FIG. 4, the voltage/current converting circuit 7 of the first embodiment receives inputs of the input voltage Vin1, the reference voltage Vref1 and bias voltage Vbias so as to output current I1. The voltage/current converting circuit 7 includes p-channel MOSFETs M24, M25. The voltage/current converting circuit 7 includes n-channel MOSFETs M20–M23. The voltage/current converting circuit 7 has a resistor R1. Drains of the FETM24 and M25 are connected to a power supply VDD. Gates of FETM24 and M25 are connected to source of the FET M24. The source of the FET M24 is connected to the drain of the FET M22 and an output terminal which outputs the current I 1. The source of the FET M25 is connected to drain of FET M23. Gate of FET M22 is connected to the input voltage Vin1. Source of the FET M22 is connected to drain of the FET M20 and an end of the resistor R1. The gate of the FET M23 is connected to the reference voltage Vref1. The source of the FET M23 is connected to the drain of the FET M21 and other end of the resistor R1. The gates of the FETM20 and M21 are connected to the bias voltage Vbias. The sources of the FETM20 and M21 are connected to grounding voltage GND.

The bias voltage Vbias allows equal currents IB1, IB2 to flow through the FETM20 and M21. The output current I1 is a differential between drain currents of the FETM22 and M23. Assuming that gate-source voltages of the FETM22, M23 are VGS(22), VGS(23), Equation 3 is established.

$$V_{in} = V_{ref} - V_{GS(23)} + R_1 I_1 + V_{GS(22)} \quad (3)$$

$$= V_{ref} - \left(\sqrt{\frac{I_B - I_1}{K_{23}}} + V_{thn}\right) + R_1 I_1 + \left(\sqrt{\frac{I_B + I_1}{K_{22}}} + V_{thn}\right) \ast$$

$$\left(K = \frac{1}{2}\mu_n C_{OX} \frac{W}{L}\right)$$

where Vthn is a threshold voltage of each of the n-channel FETM22 and M23, $\mu n$ is mobility of the electron, Cox is the unit area capacity of gate oxide film, and W and L are channel width and length of the FETM22 and M23, respectively.

Because in Equation 3, when the channel width W of each of the FETM22 and M23 is increased, an item expressed by the square root of the right side is decreased, this equation can be approximated to equation 4. Thus, output current I1 proportional to a voltage difference between Vin and Vref can be ascertained. Current gain gm1 is an inverse number of a resistance of the resistor R1.

$$R_1 I_1 \cong V_{in} - V_{ref} \therefore I_1 = \frac{1}{R_1}(V_{in} - V_{ref}) \times \left(gm = \frac{1}{R_1}\right) \quad (4)$$

(Current Controlled Oscillator of First Embodiment)

Figure 5A:
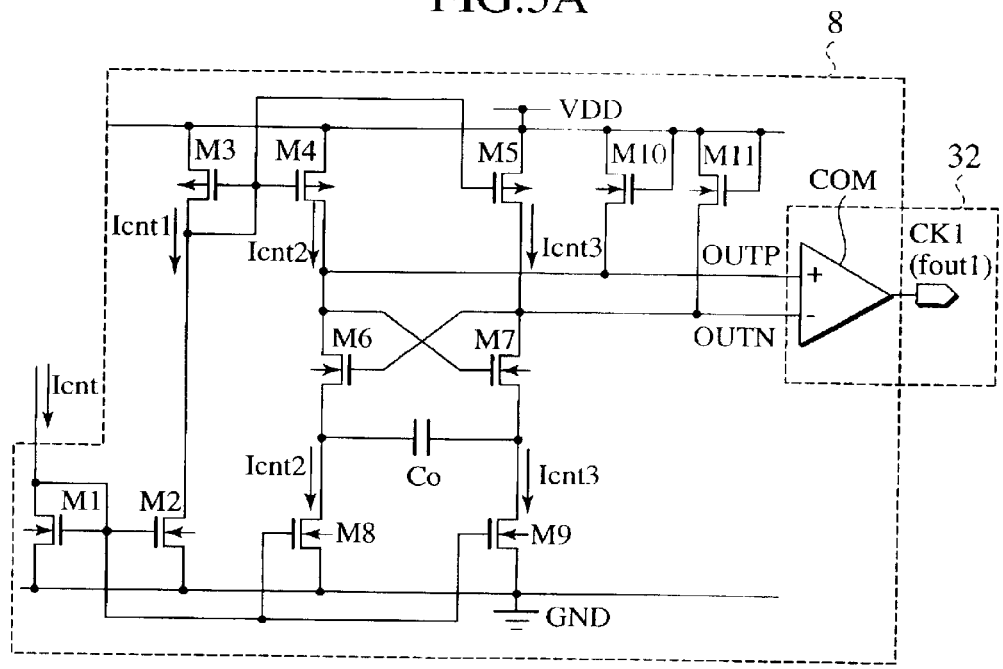
FIG. 5A is a circuit diagram of a current controlled oscillator.

As shown in FIG. 5A, the current controlled oscillator 8 of the first embodiment receives an input of control current Icnt and outputs an oscillation signal of output oscillation frequency fout1. The current controlled oscillator 8 is a current controlled oscillator which is a source coupled type multi-vibrator. The current controlled oscillator 8 includes p-channel MOSFET M3–M5, n-channel MOSFET M1, M2, M6–M11, a capacitor C0 and an output level converting circuit 32 containing a comparator COM.

A drain of the FETM1 is connected to an input terminal of the control current Icnt. Gates of the FET M1, M2, M8 and M9 are connected to a drain of the FETM1. Sources of the FET M1, M2, M8 and M9 are connected to grounding potential GND. Drains of the FETM3–M5, M10, M11 are connected to power supply potential VDD. Gates of the FETM3–M5 are connected to a source of the FET M3. The source of the FET M3 is connected to the drain of the FET M2. A source of the FET M4 is connected to a drain of the FET M6 and a gate of the FET M7. A source of the FET M6 is connected to a drain of the FET M8 and an end of the capacitor C0. A source of the FET M5 is connected to a drain of the FET M7 and a gate of the FET M6. A source of the FET M7 is connected to a drain of the FET M9 and other end of the capacitor C0. Gates of the FETM10 and M11 are connected to the power supply potential VDD. A source of the FET M10 is connected to a source of the FET M4 and a + (plus) terminal OUTP of the comparator COM. A source of the FET M11 is connected to a source of the FET M5 and a − (minus) terminal OUTN of the comparator COM.

A current of the same magnitude as the control current Icnt flows to the drain current Icnt of the FET M2. Further, a current of the same magnitude as the drain current Icnt1 flows to source currents Icnt2, Icnt3 of the FETs M4, M5. The source currents Icnt2, Icnt3 raise the potential of the capacitor C0 to a voltage Vx. This increase of the potential turns ON the FETM6 or M7. When any one of the FETM6 or M7 is turned ON, the other one of the FETM6 or M7 is turned OFF. Consequently, the FETM6 and M7 repeat the ON/OFF condition. The speed of potential rise in the capacitor C0 is proportional to the magnitude of the oscillation frequency fout1.

In the current controlled oscillator 8, the oscillation frequency fout1 is proportional to the control current Icnt as indicated by Equation 5.

$$f_{out} = \frac{I_{cnt}}{4 C_o V_X}(V_X = V_{thn} + \Delta V_X) \quad (5)$$

Here, Vx is a potential of the capacitor C0 and set to a voltage slightly higher than the threshold voltage Vthn of the FETM6 and M7. According to equation 5, the output oscillation frequency fout1 is proportional to the control current Icnt and substantially inversely proportional to the capacitor C0 and the threshold voltage Vthn of the n-channel FETM6 and M7. Current frequency conversion gain Gico of the oscillation frequency fout1 to the control current Icnt is an inverse number of four times a product of the capacitor C0 and the threshold voltage Vthn.

Figure 5B:
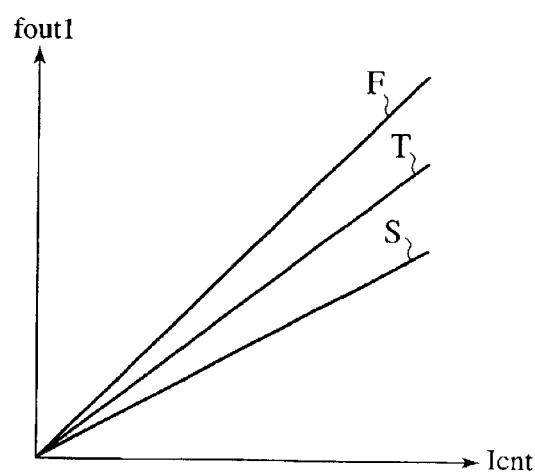
FIG. 5B is a graph of output frequency to control circuit of the current controlled oscillator.

The oscillation frequency fout1 to the input current Icnt characteristic of the multi-vibrator type current controlled oscillator 8 has a proportional relationship as shown in FIG. 5B. The current frequency conversion gain Gico, which is an inclination, may be dispersed depending on each current controlled oscillator 8. The characteristic to a typical current frequency conversion gain Gico is expressed by a line T, the characteristic to fast frequency gain Gico is expressed by a line F and the characteristic to slow frequency gain Gico is expressed by a line S. The reason why the current frequency conversion gain Gico is dispersed is the threshold voltage level Vthn of the FETM6 and M7. The dispersion of the threshold voltage Vthn can be considered to originate from manufacturing process of the semiconductor device 1 and external temperature of the operating environment.

(Reference Current Generator of the First Embodiment)

Figure 6A:
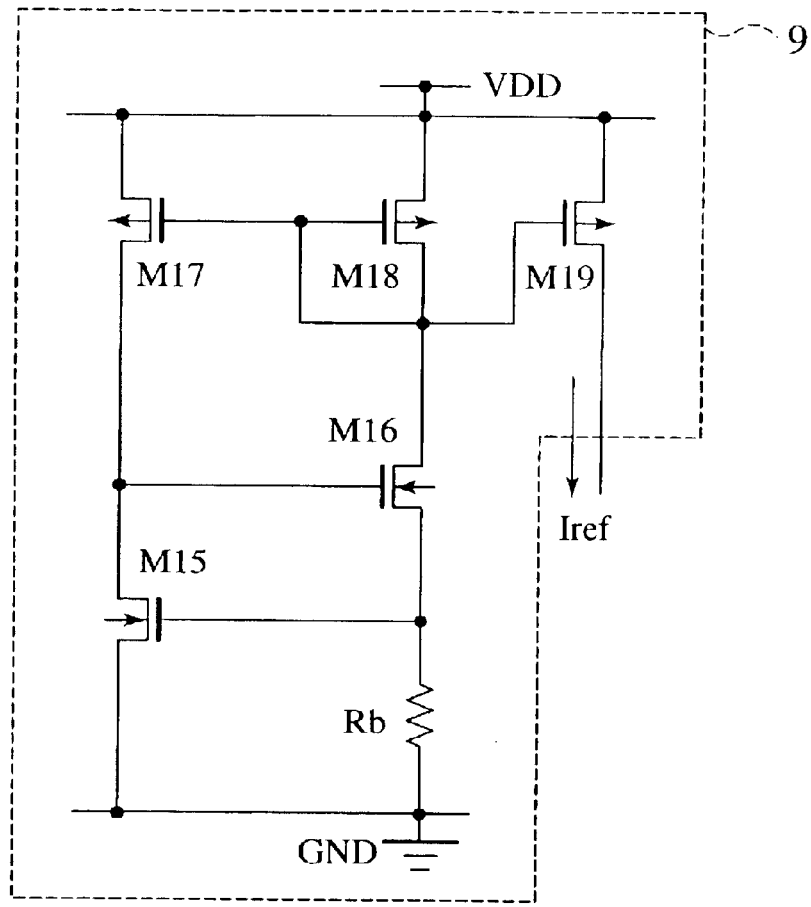
FIG. 6A is a circuit diagram of a reference current generator.

As shown in FIG. 6A, the reference current generator 9 of the first embodiment outputs the reference current Iref. The reference current generator 9 is a self-bias type bias current circuit using negative feedback. The reference current generator 9 includes p-channel MOSFETs M17–M19, n-channel MOSFETs M15, M16 and a resistor Rb.

Drains of FETM17 to M19 are connected to a power supply potential VDD. Gates of the FETM17 to M19 are connected to a source of the FET M18. A source of the FET M17 is connected to a drain of the FET M15 and a gate of the FET M16. A source of the FET M15 is connected to grounding potential GND. A source of the FET M18 is connected to a drain of the FET M16. A source of the FET M16 is connected to a gate of the FET M15 and an end of the resistor Rb. The other end of the resistor Rb is connected to grounding potential GND. A source of the FET M19 is connected to an output terminal of the reference current Iref.

The structure of the reference current generator 9 needs to be selected depending on the structure of the current controlled oscillator 8. Selecting an appropriate combination between the reference current generator 9 and the current controlled oscillator 8 enables the oscillation frequency fout1 of the current controlled oscillator 8 to reduce its sensitivity Δfout to a process disparity and a change ΔVn of the operation environment.

The value of gate-source voltage VGS (15) of the FET M15 is determined by the voltage/current characteristic of the FET M15 and resistance Rb and can be obtained according to equation 6.

$$I_{15} = K_{15}(V_{GS(15)} - V_{thn})^2$$

$$V_{GS(15)} = R_b I_{15} \quad (6)$$

where I15 is a drain current of the FET M15 and K15 is a constant of the FET M15. Further, equation 7 is obtained from equation 5.

$$I_{15} = \frac{1}{R_b}\left(\sqrt{\frac{I_{15}}{K_{15}}} + V_{thn}\right) \quad (7)$$

From this, it is evident that when K15 is large or the gate width W of the FET M15 is large, the item of the square root is smaller than the threshold voltage Vthn. When the value of this square root is ΔV, this can be approximated to equation 8.

$$I_{ref} = I_{15} \cong \frac{(\Delta V + V_{thn})}{R_b} \quad (8)$$

When the reference current Iref expressed by equation 8 to the current controlled oscillator 8 as the control current Icnt for the current controlled oscillator 8, the oscillation frequency fout1 can be obtained according to equation 9 by substituting equation 8 for equation 5.

$$f_{out} = \frac{I_{ref}}{4C_oV_X} = \frac{I_{ref}}{4C_o(V_{thn} + \Delta V_X)} = \frac{1}{4C_oR_b} \cdot \frac{V_{thn} + \Delta V}{V_{thn} + \Delta V_X} \quad (9)$$

When ΔV and ΔVx are smaller than Vthn to some extent, the fout1 can be approximated to equation 10.

$$f_{out} \cong \frac{1}{4C_oR_b} \quad (10)$$

Dependency on the threshold Vthn of the oscillation frequency fout1 can be compensated. That is, when the control current Icnt is equal to the reference current Iref, the oscillation frequency fout1 does not depend on dispersion of transistor characteristics.

Figure 6B:
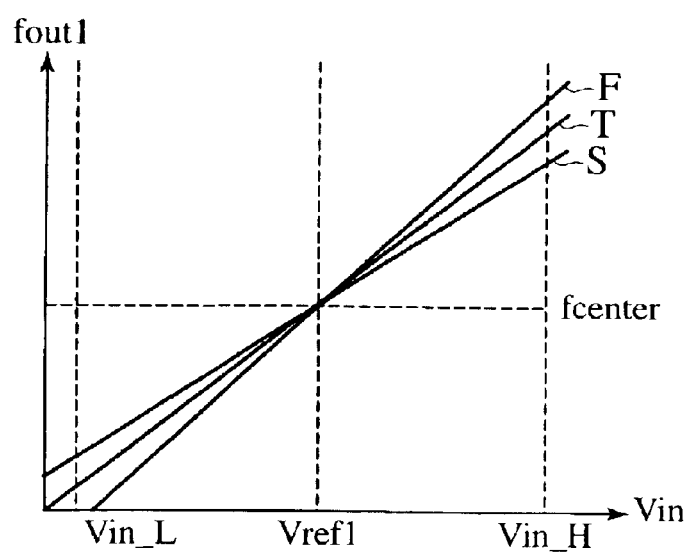
FIG. 6B is a graph of output frequency of the VCO to input voltage.

In the voltage control oscillation circuit VCO1 shown in FIG. 3B, when the input voltage Vin1 is equal to the reference voltage Vref1 (Vin=Vref1) and current Ic is zero (Ic=0), the current I1 is zero (I1=0) and the control current Icnt is equal to the reference current Iref (Icnt=Iref). At this time, the osciallation frequency fout1 becomes a stabilized frequency fcenter determined by the reference current Iref outputted from the reference current generator 9 as shown in FIG. 6B. Here, the reference current Iref is so constructed to output an intermediate frequency fcenter in the oscillation frequency range of a oscillation frequency fout1 requested for the voltage control oscillation circuit VCO 1. Thus, when the input voltage Vin is changed with reference to the reference voltage Vref1, the output frequency fout1 is changed with reference to the intermediate frequency fcenter.

To satisfy the requested oscillation frequency range, the current gain gm1 of the voltage/current converting circuit 7 is adjusted. Further, as shown in FIG. 6B, the input voltage Vin is changed from the reference voltage Vref1. The variable range of the input voltage Vin is minimum input voltage Vin L to maximum input voltage Vin H. When the input voltage Vin is equal to the reference voltage Vref1 (Vin=Vref1), a stabilized intermediate frequency fcenter is outputted. The oscillation frequency gain (gm1×Gico) is determined by the current gain gm1 of the voltage/current converting circuit 7 and the current frequency conversion gain Gico of the current controlled oscillator 8. The voltage/current converting circuit 7 and the current controlled oscillator 8 are affected by process dispersion and operation environment of the semiconductor integrated circuit 1. The characteristic to typical oscillation frequency gain (gm1× Gico) is expressed by a line T, the characteristic to fast oscillation frequency gain (gm1×Gico) is expressed by a line F and the characteristic to slow oscillation frequency gain (gm1×Gico) is expressed by a line S. Because the intermediate frequency fcenter is unlikely to change due to the effect of the reference current Iref, the range in which the oscillation frequency fout1 changes is small in the variable range of the input voltage Vin from slow input voltage Vin L to fast input voltage Vin H.

(Operation of VCO Circuit of the First Embodiment)

As shown in in FIG. 3B, the VCO circuit VCO 1 of the first embodiment includes the voltage/current converting circuit 7, the control current circuit 10, the reference current generator 9, the current controlled oscillator 8 and the adder 22. When the input voltage Vin1, the reference voltage Vref1 and the control signal E are inputted, the VCO 1 outputs the clock signal CK1 of the output frequency fout1.

The voltage/current converting circuit 7 outputs the output current I1 proportional to a voltage difference between the input voltage Vin1 and the reference voltage Vref1. The proportionality factor is current gain gm1.

The reference current generator 9 outputs the reference current Iref, which is constant current.

The control current circuit 10 outputs the control current Ic which is changeable by the control signal E1. The control current circuit 10 converts the control signal E1 to the control current Ic.

The adder 22 sets the control current Icnt to a sum value of the output current I1, the reference current Iref and the control current Ic.

The current controlled oscillator 8 outputs the clock signal CK1 of the output frequency fout1 proportional to the control current Icnt.

When the frequency gain of the current controlled oscillator 8 is Gico, the output frequency fout1 is expressed by equation 2.

$$f_{out} = G \times I_{cnt} = G \times (I_{1+Iref}) \quad (2)$$

A frequency produced by multiplying the reference current Iref with the gain Gico is the intermediate frequency fcenter 1 of the output frequency fout1 shown in (a) of FIG. 6.

The reference current Iref of the reference current generator 9 has an effect of correcting a change of the output frequency fout1 due to process dispersion of the current controlled oscillator 8 and a change of the operation environment. Then, the reference current Iref stabilizes the intermediate frequency fcenter 1 of the output frequency fout1. By changing the control current Ic of the control current circuit 10 with respect to this intermediate frequency fcenter 1, the output frequency fout1 can be increased/ decreased. Controlling the control current Ic enables the output frequency fout1 to be oscillated in a wide frequency range around the intermediate frequency fcenter 1. On the other hand, controlling the input voltage Vin1 enables the output frequency fout1 having a small frequency gain (gm1× Gico) to oscillate in a narrow frequency range. These controls are combined as shown in (b) of FIG. 6. Each control is independent. The output frequency fout1 is obtained from a sum of the effects of these controls. For this reason, the VCO 1 has a wide oscillation frequency range. Further, the VCO 1 has a small frequency gain (gm1×Gico). Then, the VCO 1 is unlikely to be affected by a disturbance. The VCO 1 has a stable characteristic to changes of the operation environment such as power supply voltage and temperature.

As compared to the VCO 10 of FIG. 1A, the VCO 1 of the first embodiment is additionally provided with the control current circuit 10 as shown in FIG. 3B, so as to add a control current Ic capable of controlling the oscillation frequency fout1.

Figure 7:
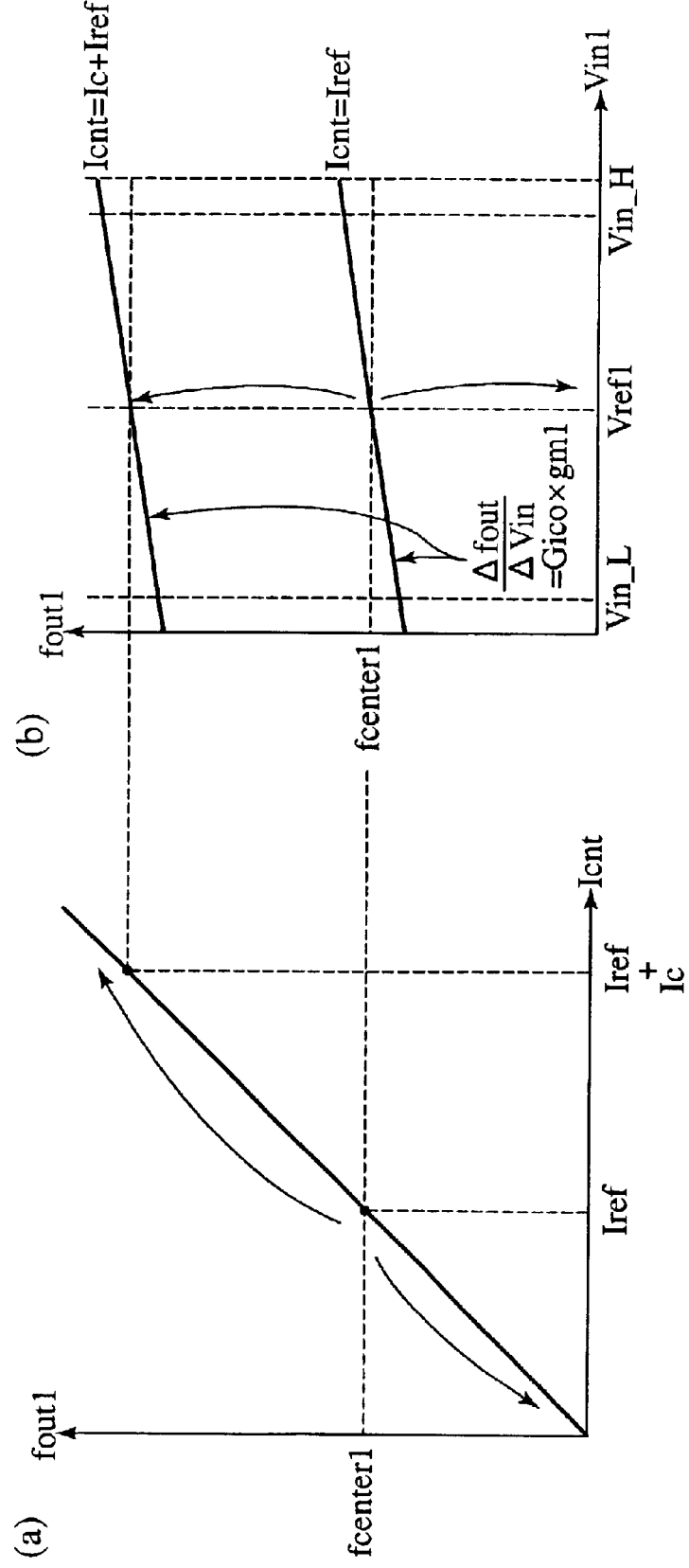
FIG. 7 has a graph (a) and a graph (b). The graph (a) is a graph of output frequency of the current controlled oscillator to control current. The graph (b) is a graph of the output frequency of the VCO to input voltage.

When the input voltage Vin1 is equal to the reference voltage Vref1 (Vin1=Vref1) and the control current Ic is zero (Ic=0), the control current Icnt becomes equal to the reference current Iref (Icnt=Iref) as shown in FIG. 7, so that the intermediate frequency fcenter 1 is determined by the reference current Iref. By adding the control current Ic to the control current Icnt (Icnt=Iref+Ic), the intermediate frequency fcenter 1 can be changed as shown in FIG. 7(a). When the input voltage Vin1 is equalized with the reference voltage Vref1 (Vin1=Vref1) and then the control current Ic is changed, the oscillation frequency fout1 is changed. Because the value of the control current Ic can be positive/negative, the value of the control current Icnt can be increased or decreased with respect to the reference current Iref. By setting the current value of the control current Ic to a positive value or a negative value, the oscillation frequency fout1 can be made higher or lower than fcenter 1.

When the current frequency conversion gain of the current controlled oscillator 8 is Gico, the oscillation frequency fout1 of the VCO circuit VCO 1 is expressed as shown in equation 11.

$$f_{out} = G_{ico}(gm_1(V_{in} - V_{ref}) + I_{ref} + I_c) \quad (11)$$

At this time, $$\frac{df_{out}}{dV_{in}} = G_{ico} \times gm_1 \quad (12)$$

The oscillation frequency gain of the VCO circuit VCO 1, which is obtained by differentiating equation 11 with the input voltage Vin1 is Gico×gm1 as indicated by equation 12. An equal oscillation frequency gain Gico×gm1 to the VCO 10 of FIG. 1A can be obtained. Because the oscillation frequency gain Gico×gm1 is not changed, the VCO is never affected by disturbance and when the PLL circuit is provided, the loop gain is not changed. For the VCO 1 of the first embodiment, the maximum input voltage Vin H and the minimum input voltage Vin L of the input voltage Vin1 are equal to the VCO 10 and by adding the control current circuit 10, the frequency range of the oscillation frequency fout1 can be expanded. The VCO 1 can achieve an oscillation frequency characteristic stable to a process dispersion or a change of the operation environment. Further, the VCO 1 is highly resistant to influences of disturbance and capable of oscillation in a wide frequency range.

(Second Embodiment)

Figure 8:
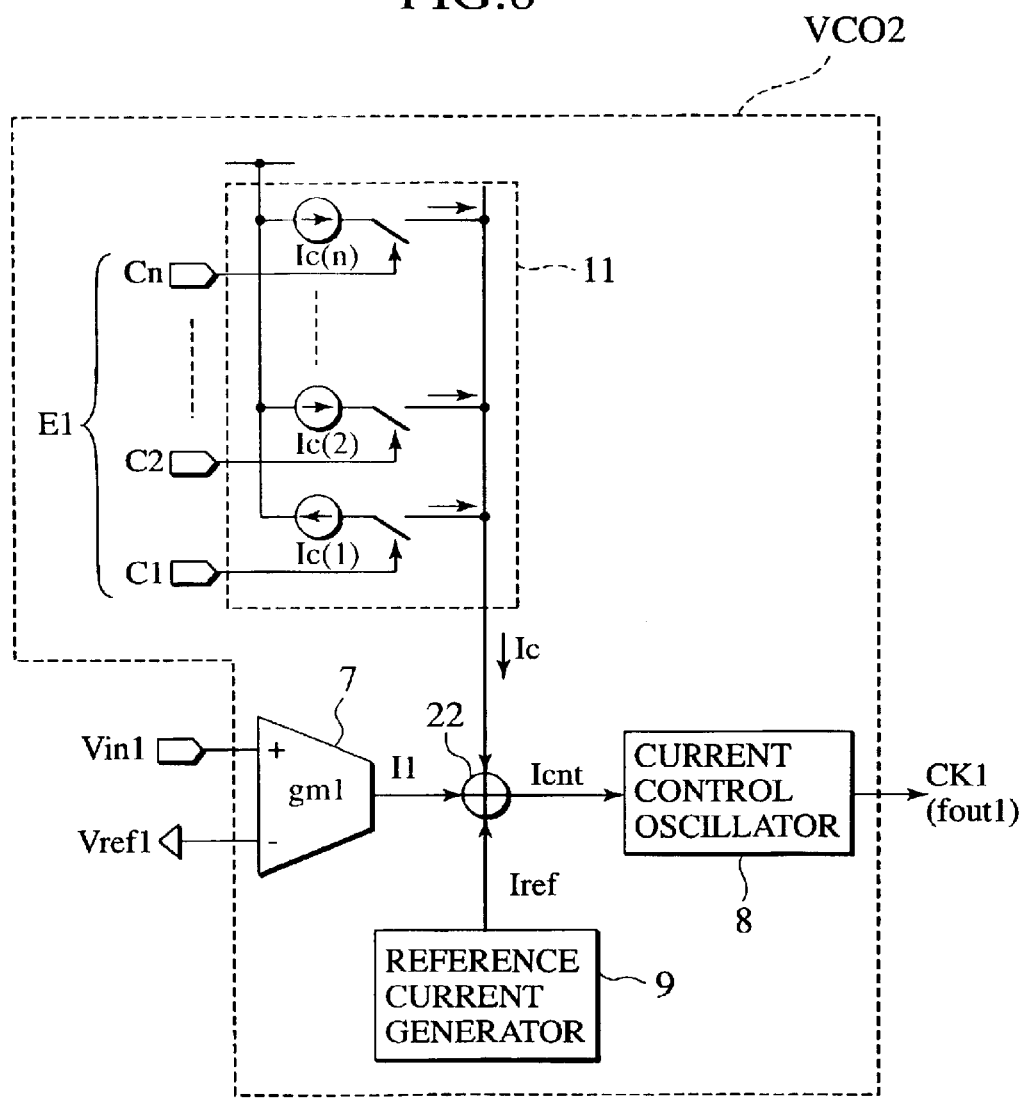
FIG. 8 is a block diagram of a VCO according to the second embodiment.

As shown in FIG. 8, the VCO 2 of the second embodiment receives inputs of the input voltage Vin1, the reference voltage Vref1 and the control signal E1 and outputs the clock signal CK1 of the output frequency fout1. The VCO 2 includes the voltage/current converting circuit 7, the reference current generator 9, the current controlled oscillator 8 and the adder 22 like the VCO 1 of FIG. 3B. The VCO 2 has a control current circuit 11. The control current circuit 11 has a structure different from the control current circuit 10 and operates in a different way. The control current circuit 11 has plural current sources Ic(1)–Ic(n) capable of controlling the oscillation frequency fout1. The control signal E1 is constituted of input signals C1–Cn. The control current circuit 11 outputs the control current Ic from plural power supplies Ic(1)–Ic(n) which can be turned ON/OFF by the input signal C1–Cn.

Figure 9:
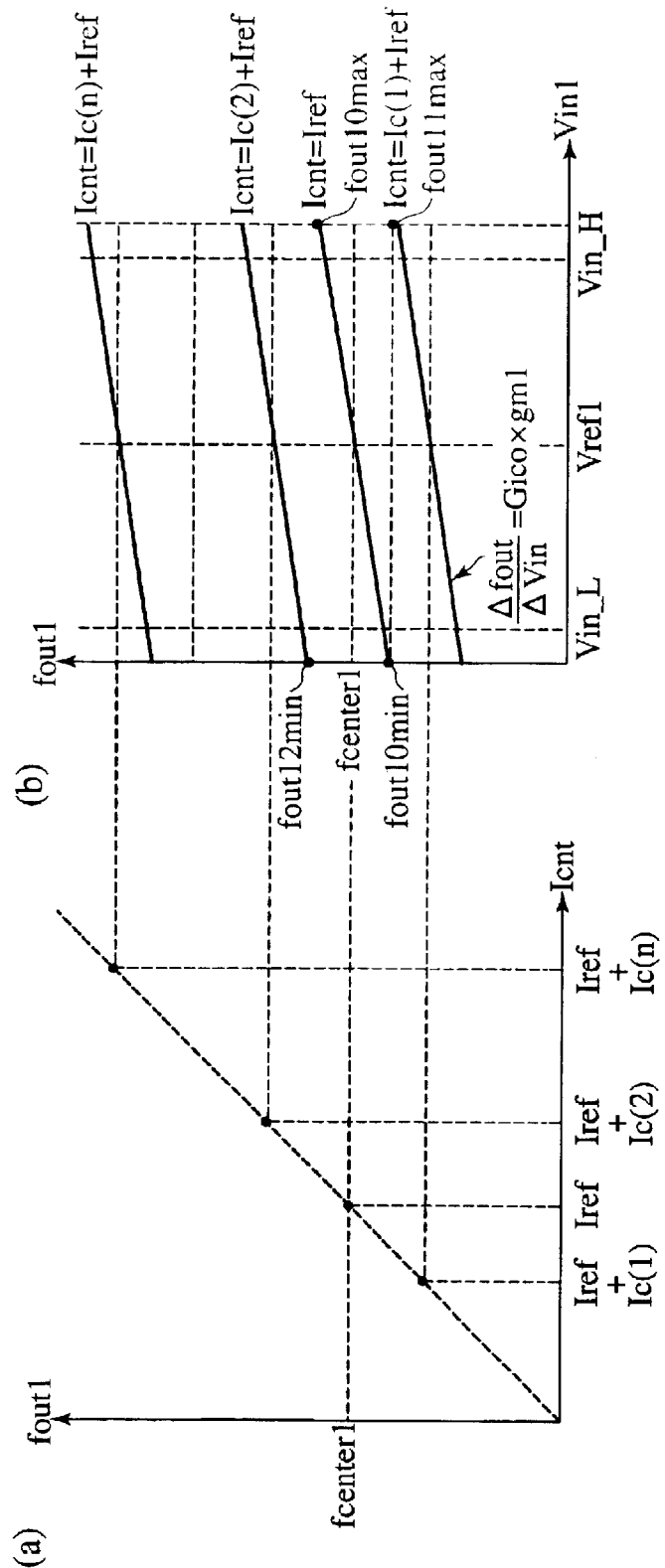
FIG. 9 has a graph (a) and a graph (b). The graph (a) is a graph of output frequency of the current controlled oscillator to control current. The graph (b) is a graph of the output frequency of the VCO to input voltage.

As shown in FIG. 9(a), the control current circuit 11 selects from plural current source circuits Ic(1)–Ic(n) according to the input signal C1–Cn so as to change the control current Icnt thereby the output frequency fout1 being changed.

When the input voltage Vin1 is equal to the reference voltage Vref1 (Vin1=Vref1) and the control current Ic(1)–Ic(n) is zero (Ic(1)=0, –, Ic(n)=0), as shown in FIG. 9(a), (b), the control current Icnt becomes equal to the reference current Iref (Icnt=Iref) and the intermediate frequency fcenter1 is set by the reference current Iref.

Adding any one of the control current Ic(1)–Ic(n) to the control current Icnt (for example, Icnt=Iref+Ic(n)) enables the output frequency fout1 to be changed as shown in FIG. 9(a). Because the control current Ic(1)–In(n) can be positive or negative, the value of the control current Icnt can be increased or decreased with respect to the reference current Iref. By setting the current value of the control current Ic(1)–Ic(n) to a positive value (for example, Ic(2)) or a negative value (for example, Ic(1)), the output frequency fout1 can be higher or lower than fcenter1. Further, selecting and combining plural current values of the control current Ic(1)–Ic(n) all at once enables the output frequency fout1 to cover a wide frequency range.

The oscillation frequency gain of the VCO 2 is Gico×gm1 as shown in FIG. 9(b). Equal oscillation frequency gain Gico×gm1 to the VCO 10 of FIG. 1A can be obtained. Because the oscillation frequency gain Gico×gm1 is not changed, the VCO is not affected by disturbance, so that when the PLL circuit is constructed, the loop gain is not changed. When a control current circuit 10 is added to the VCO 10 without changing the maximum input voltage VinH and the minimum input voltage VinL of the input voltage Vin1, the VCO 2 of the second embodiment can expand the frequency range of the oscillation frequency fout1.

As required, the oscillation frequency fout1 is outputted continuously. For this purpose, the oscillation frequency fout11 max. when the reference current Iref and the control current Ic(1) are inputted to the current control oscillation circuit 8 and the maximum input voltage VinH of the input voltage Vin1 is inputted to the voltage/current converting circuit 7 only has to be more than the oscillation frequency fout1 min. when the reference current Iref is inputted to the current control oscillation circuit 8 and the minimum input voltage VinL of the input voltage Vin1 is inputted to the voltage/current converting circuit 7 as shown in FIG. 9(b). Likewise, the oscillation frequency fout1 only has to be more than the oscillation frequency fout12 min.

The VCO 2 is adaptable for use with the PLL 1 of FIG. 3A instead of the VCO 1.

(Third Embodiment)

Figure 10:
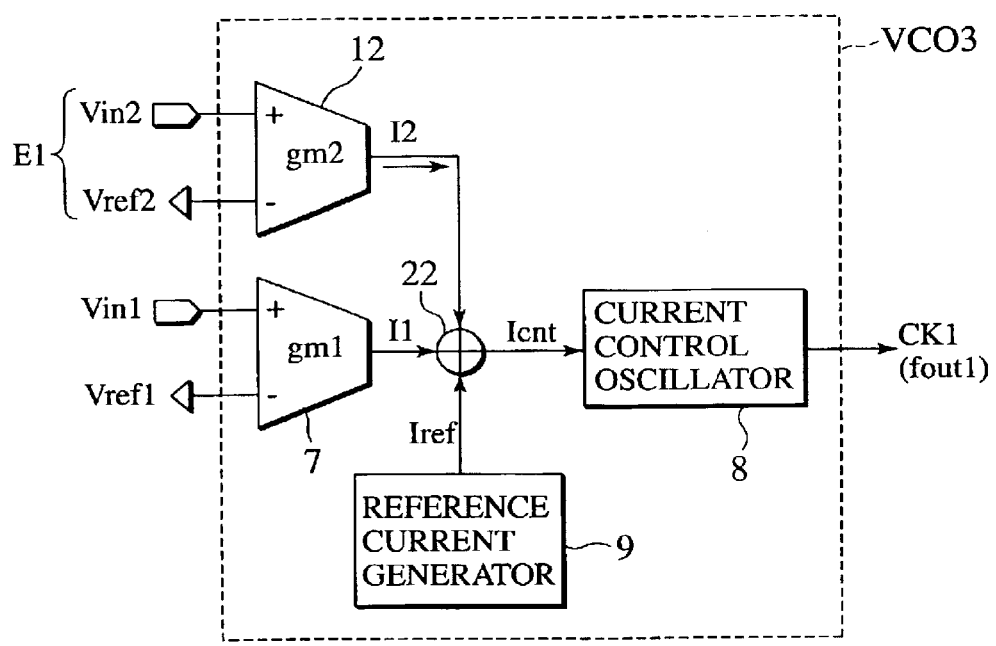
FIG. 10 is a block diagram of a VCO according to the third embodiment.

As shown in FIG. 10, the VCO 3 of the third embodiment receives inputs of the input voltage Vin1, the reference voltage Vref1, the input voltage Vin2, and the reference voltage Vref2 and outputs an oscillation signal of the output oscillation frequency fout1. The input voltage Vin2 and the reference voltage Vref2 constitute the control signal E1. The VCO 3 includes the voltage/current converting circuit 7, the reference current generator 9, the current control oscillation circuit 8 and the adder 22 like the VCO 1 of FIG. 3B. The VCO 3 contains a voltage/current converting circuit 12. The voltage/current converting circuit 12 can be regarded as the control current circuit 10 in the control current circuit 10 of FIG. 3B. The current Ic on the control current circuit 10 of FIG. 3B can be regarded as an output current I2 on the voltage/current converting circuit 12.

The voltage/current converting circuit 12 has the same function as the control current circuit 10 of FIG. 3B. The voltage/current converting circuit 12 outputs a current I2 proportional to a voltage difference between the input voltage Vin2 and the reference voltage Vref2. The proportionality coefficient is gain gm2. By changing the input voltage Vin2 continuously, the voltage/current converting circuit 12 can output the current I2 continuously, so that as shown in FIG. 11(a), the output frequency fout1 can be changed continuously. The current gain gm2 of the voltage/current converting circuit 12 is set to a value larger than the current gain gm1 of the voltage/current converting circuit 7. Consequently, as shown in FIG. 11(a), the output frequency fout1 can cover a large variable frequency range against a change of the input voltage Vin2.

Because when the input voltage Vin1 is equal to the reference voltage Vref1 (Vin1=Vref1) and the input voltage Vin2 is equal to the reference voltage Vref2 (Vin2=Vref2), the control currents I1, I2 are zero (I1=0, I2=0), the output oscillation frequency fout1 becomes the intermediate frequency fcenter1 as shown in FIGS. 11(a), (b). The control current Icnt becomes equal to the reference current Iref (Icnt=Iref) and the intermediate frequency fcenter1 is determined by the reference current Iref.

The reference current generator 9 inputs the reference current Iref into the current control oscillation circuit 8. When a maximum input voltage Vin2H is inputted to the voltage/current converting circuit 12 as the input voltage Vin2 as shown in FIG. 11(a) (Vin2=Vin2H), a line (1) of FIG. 11(b) is obtained. When the reference voltage Vref2 is inputted to the voltage/current converting circuit 12 as the input voltage Vin2 (Vin2=Vref2), a line (2) is obtained. When a minimum input voltage Vin2L is inputted to the voltage/current converting circuit 12 as the input voltage Vin2 (Vin2=Vin2L), a line (3) is obtained.

As shown in FIG. 11(a), the maximum input voltage Vin2H is inputted to the voltage/current converting circuit 12 as the input voltage Vin2. As shown in FIG. 11(b), the maximum input voltage Vin1H is inputted to the voltage/current converting circuit 7 as the input voltage Vin1. At this time, a maximum value fmax of the oscillation frequency fout1 is obtained. Likewise, when the minimum input voltage Vin2L is inputted to the voltage/current converting circuit 12 as the input voltage Vin2 while the minimum input voltage Vin1L is inputted to the voltage/current converting circuit 7 as the input voltage Vin1, a minimum value fmin of the oscillation frequency fout1 is receiveed.

As shown in FIG. 11(b), the oscillation frequency gain Gico×gm1 is small compared to a change of the input voltage Vin1 and equal to the oscillation frequency gain Gico×gm1 of the VCO1 of FIG. 3B. Thus, the VCO 3 is unlikely to be affected by disturbance.

The VCO 3 is adaptable to the PLL 1 of FIG. 3A instead of the VCO 1.

(Fourth Embodiment)

Figure 12A:
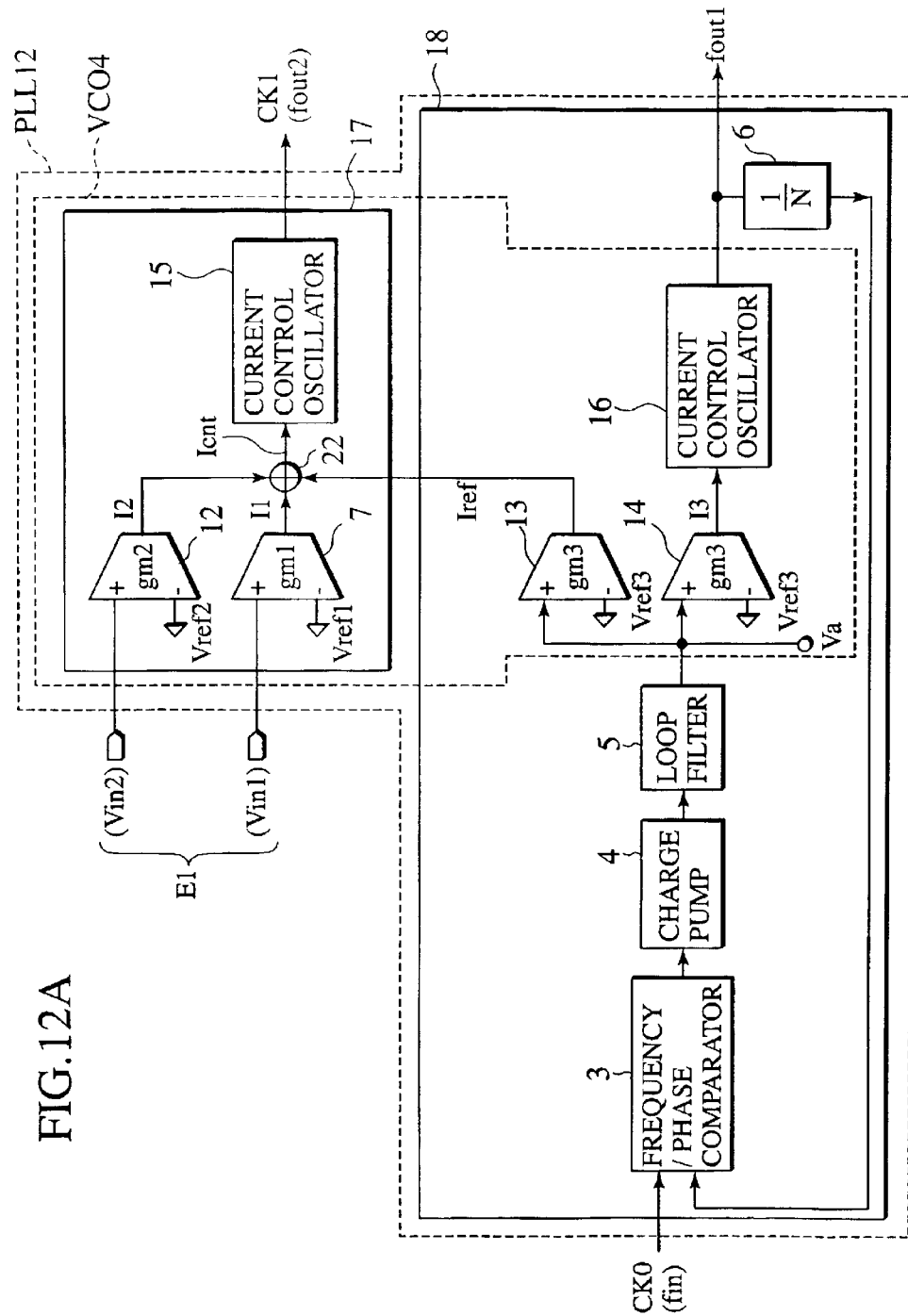
FIG. 12A is a block diagram of PLL circuit and VCO according to the fourth embodiment.
Figure 12B:
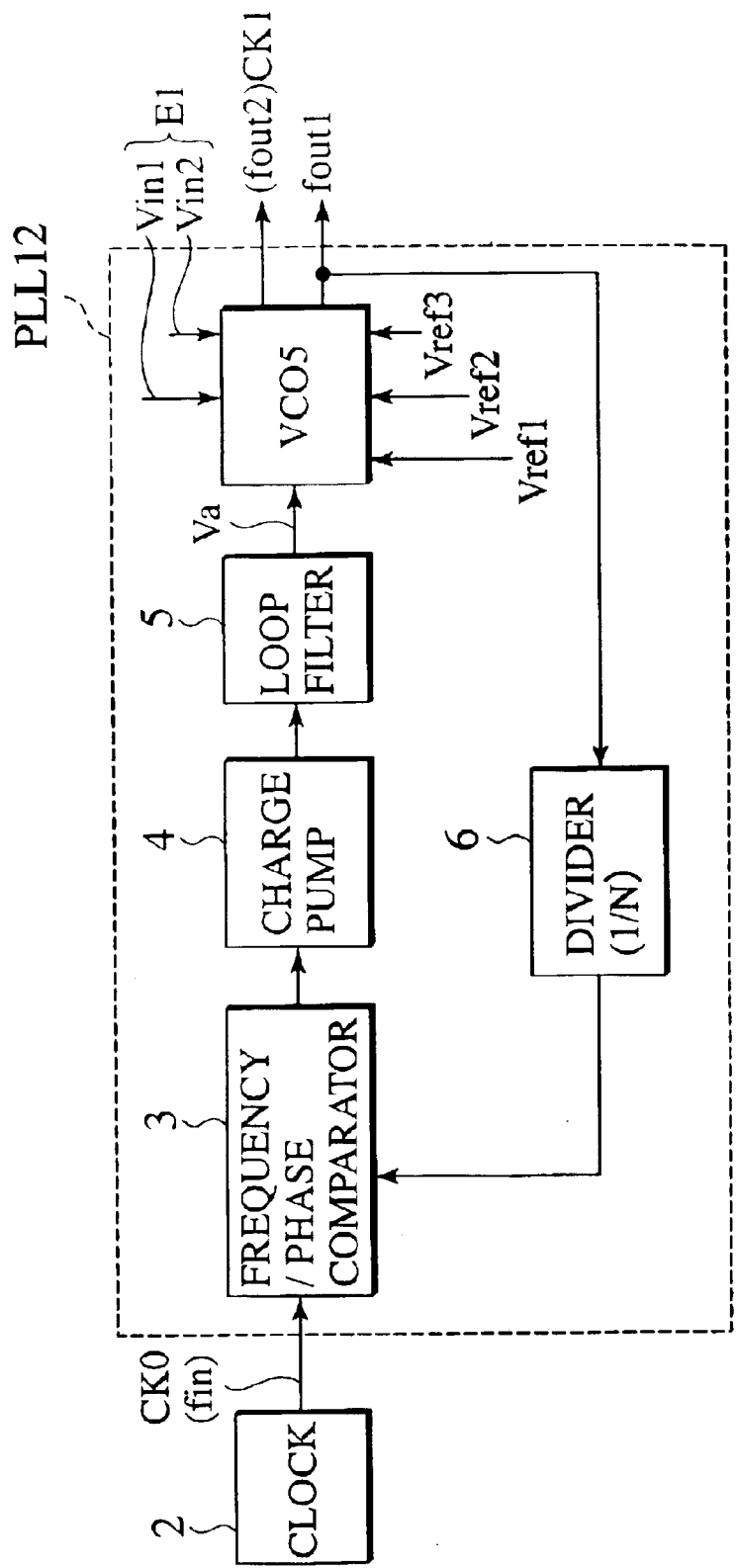
FIG. 12B is a block diagram of PLL circuit according to the fourth embodiment.

As shown in FIGS. 12A, 12B, the PLL 12 of a fourth embodiment receives inputs of the input voltages Vin1, Vin2, the reference voltages Vref1, Vref2, Vref3 and the clock signal CK0 of input frequency fin and outputs the clock signal CK1 of the output frequency fout2 and the oscillation signal of the output frequency fout1. The input voltages Vin1, Vin2 constitute the control signal E1. The PLL 12 includes the voltage/current converting circuits 7, 12, a current control oscillation circuit 15 and the adder 22 like the VCO 3 of FIG. 10. Then, the voltage/current converting circuits 7, 12, the current control oscillation circuit 15 and the adder 22 constitute an oscillation circuit 17.

The PLL 12 includes a reference current generator 18 instead of the reference current generator 9 in the VCO 3. The reference current generator 18 contains a phase locked loop (PLL) circuit. The PLL circuit of the reference current generator 18 includes the frequency/phase comparator 3, the charge pump 4, the loop filter 5, the divider 6, a voltage/current converting circuit 14 and a current control oscillation circuit 16. The voltage/current converting circuit 14 outputs a output current I3 obtained by multiplying a voltage difference between the control voltage Va and the reference voltage Vref with the gain gm3. The current control oscillation circuit 16 outputs an oscillation signal of the frequency fout1 obtained by multiplying the gain Gico of the output current I3 with the gain Gico. The divider 6 outputs a frequency obtained by dividing the frequency fout1 by N (N is an integer of 2 or more). The frequency phase comparator 3 receives a difference between a second frequency fout1 divided by 1/N and the reference frequency fin. The charge pump 4 outputs an output current proportional to that difference. The loop filter (low-pass filter) 5 outputs a control voltage Va proportional to a value obtained by integrating the output current. The VCO circuit is constituted of the voltage/current converting circuit 14 and the current control oscillation circuit 16.

The plus (+) input terminal Va of the voltage/current converting circuit 14 is connected to a plus (+) input terminal of a voltage/current converting circuit 13. The reference voltage Vref3 is connected to the minus (–) input terminals of the voltage/current converting circuits 13 and 14 in common. Thus, the output current Iref of the voltage/current converting circuit 13 is equal to the output current I3 of the voltage/current converting circuit 14. Then, when the PLL circuit of the reference current generator 18 is locked, the third control voltage Va, the second frequency fout1 and the third output current I3 are constant.

The voltage/current converting circuit 13 adds a constant current Iref equal to the output current I3 to the control current Icnt. When the input voltage Vin1 is equal to the reference voltage Vref1 (Vin1=Vref1) and the input voltage Vin2 is equal to the reference voltage Vref2 (Vin2=Vref2), the control currents I1, I2 are zero (I1=0, I2=0), so that as shown in FIGS. 13(a), (b), the output oscillation frequency fout2 becomes the intermediate frequency fcenter (fout2=fcenter). The control current Icnt becomes equal to the reference current Iref (Icnt=Iref) and the intermediate frequency fcenter is determined by the reference current Iref.

The current I3 is equal to the reference current Iref (I3=Iref). The oscillation frequency gain of a current control oscillation circuit 15 is equal to that of the current control oscillation circuit 16. The second frequency fout 1 is equal to the intermediate frequency fcenter of the output oscillation frequency fout2 (fout1=fcenter). The reference current generator 18 has the same function as the reference current generator 9 in that the reference current Iref is outputted. The reference current generator 18 can output a reference current Iref more stable than the reference current generator 9. The reference current Iref is supplied to the current control oscillation circuit 15. Consequently, a more stable intermediate frequency fcenter can be outputted.

Next, the operation of the reference current generator 18 will be described in detail. When the PLL circuit of the reference current generator 18 is locked, the current I3 maintains a stable constant value. Because the output current Iref is equal to the current I3, a stable constant value is maintained. The output oscillation frequency fout1 of the current control oscillation circuit 16 is outputted as the intermediate frequency fcenter shown in equation 13.

$$f_{out1} = f_{center} = N \times f_{in1} \quad (13)$$

The current control oscillation circuit 15 oscillates with the reference current Iref of the reference current generator 18. The intermediate frequency fcenter of the output oscillation frequency fout2 of the current control oscillation circuit 15 is equal to the output oscillation frequency fout1 as shown by equation 14.

$$f_{out2} = f_{out1} = f_{center} = N \times f_{in1} \quad (14)$$

Thus, the intermediate frequency (free-run frequency) fcenter of the output oscillation frequency fout2 can be controlled accurately by the input oscillation frequency fin of the reference clock 2 of the PLL circuit.

Figure 11:
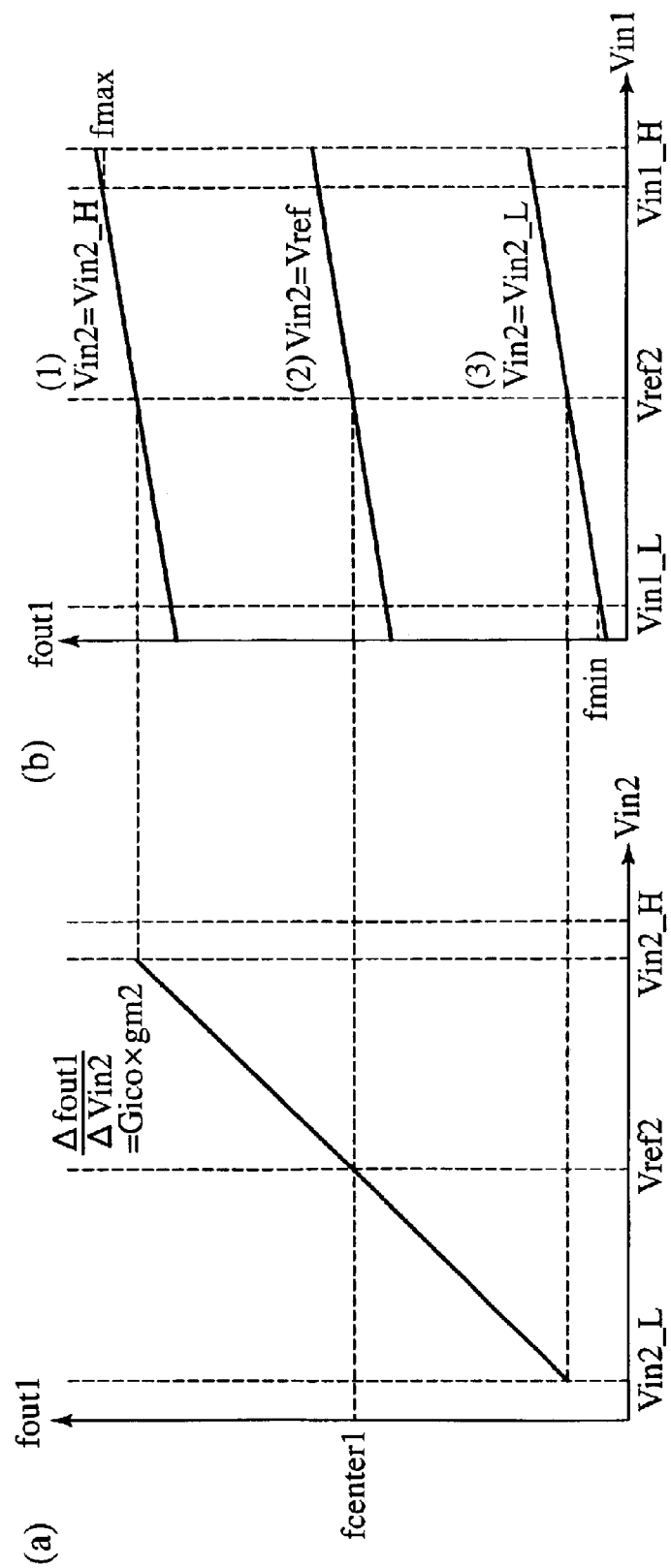
FIG. 11 has a graph (a) and a graph (b). The graph (a) is a graph of output frequency of the VCO to input voltage Vin2. The graph (b) is a graph of output frequency of the VCO to input voltage Vin1.
Figure 13:
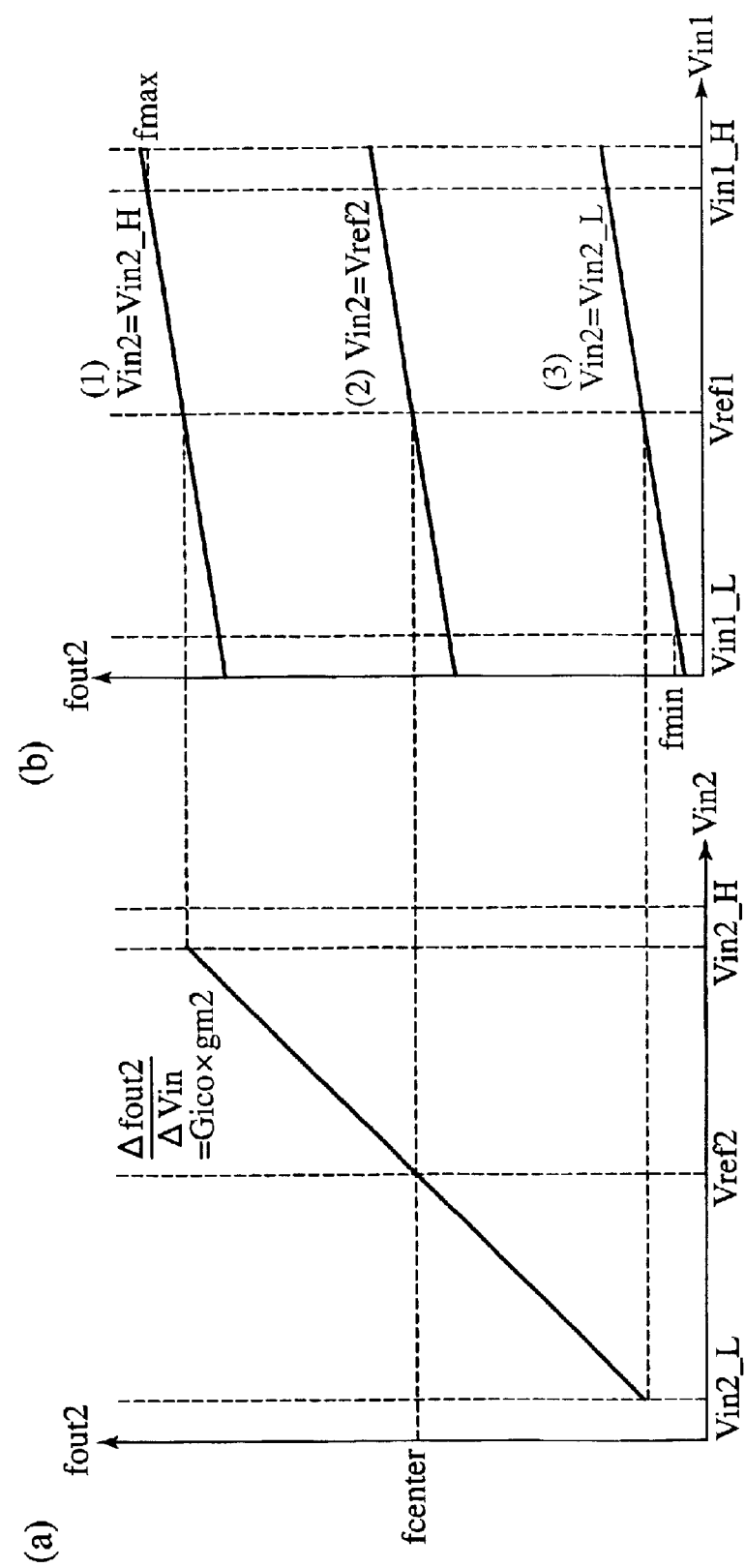
FIG. 13 has a graph (a) and a graph (b). The graph (a) is a graph of output frequency of the VCO to input voltage Vin2. The graph (b) is a graph of output frequency of the VCO to input voltage Vin2.

By changing the input voltages Vin1, Vin2 as shown in FIGS. 13(*a*), (*b*), the oscillation frequency fout2 can be controlled as in FIGS. 11(*a*), (*b*). When the oscillation frequency gains of the current control oscillation circuits 15, 16 are set to Gico equally, the oscillation frequency fout2 is expressed according to equation 15.

$$f_{out2} = f_{center} + G_{ico} \times (gm_1 \Delta V_{in1} + gm_2 \Delta V_{in2}) \quad (15)$$
$$= N \times f_{in1} + G_{ico}gm_1(V_{in1} - V_{ref}) + G_{ico}gm_2(V_{in2} - V_{ref})$$

The voltage/current converting circuit 7 can achieve a current gain gm1 having a negative value by exchanging the positive input terminal Vin1 with the negative input terminal Vref1. Likewise, the voltage/current converting circuit 12 also can achieve a current gain gm2 having a negative value by exchanging the positive input terminal Vin2 with the negative input terminal Vref2. When the current gain gm2 is set quite larger than the current gain gm1 (gm2>gm1), the oscillation frequency fout2 can control a wide oscillation frequency range with the input voltage Vin2 as shown in FIG. 13(*a*). However, because the oscillation frequency gain (Gico×gm2) to the input voltage Vin2 is large, so that the VCO is not affected by disturbance, a means for stabilizing the input voltage Vin2 is necessary. The current gain gm3 only has to be equal to or larger than the current gain gm2 (gm3>gm2).

Because the current gain gm1 is smaller than the current gain gm2, disturbance influence mixed in the input terminal Vin1 is small although the variable frequency range is narrow.

The reference current generator 18 inputs the reference current Iref into the current control oscillation circuit 15. When a maximum input voltage Vin2H is inputted to the voltage/current converting circuit 12 as the input voltage Vin2 as shown in FIG. 13(*a*) (Vin2=Vin2H), a line (1) is obtained as shown in FIG. 13(*b*). When the reference voltage Vref2 is inputted to the voltage/current converting circuit 12 as the input voltage Vin2 (Vin2=Vref2) a line (2) is obtained, When a minimum input voltage Vin 2L is inputted to the voltage/current converting circuit 12 as the input voltage Vin2 (Vin2=Vin2L), a line (3) is obtained.

The maximum input voltage Vin2H is inputted to the voltage/current converting circuit 12 as the input voltage Vin2 as shown in FIG. 13(*a*). The maximum input voltage Vin1H is inputted to the voltage/current converting circuit 7 as the input voltage Vin1 as shown in FIG. 13(*b*). At this time, the maximum value fmax of the oscillation frequency fout2 is obtained. When the minimum input voltage Vin2L is inputted to the voltage/current converting circuit 12 as the input voltage Vin2 and the minimum input voltage Vin1L is inputted to the voltage/current converting circuit 7 as the input voltage Vin1, a minimum value fmin of the oscillation frequency fout2 is obtained.

The PLL 12 of the fourth embodiment can be regarded as the VCO 4. As shown in FIGS. 12A, 12B, the VCO 4 receives inputs of the input voltages Vin1, Vin2, Va and the reference voltages Vref1, Vref2, Vref3 and outputs oscillation signals of the output oscillation frequencies fout1, fout2. The VCO 4 includes the voltage/current converting circuits 7, 12–14, the current control oscillation circuits 15, 16 and the adder 22.

The PLL 12 is adaptable to the PLL1–PLL5 shown in FIG. 2. The clock signals CK1–CK5 of the output frequency fout2 are outputted from the PLL1–PLL5 as outputs to the CPU, drivers 1–4. Consequently, the variable clock signals CK1–CK5 of the output frequency fout2 can be inputted to the CPU and the drivers 1–4.

(Fifth Embodiment)

Figure 14A:
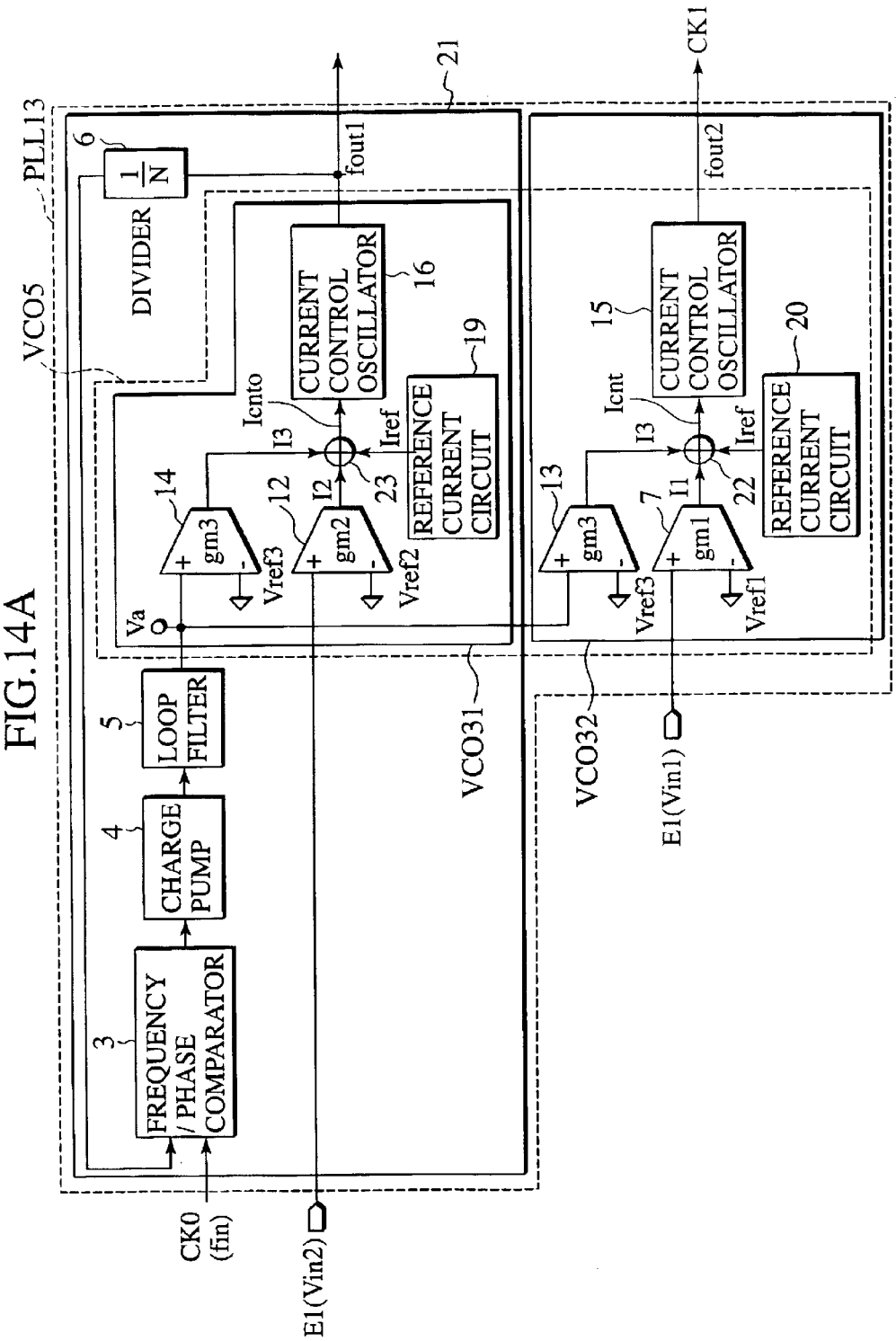
FIG. 14A is a block diagram of PLL circuit and VCO according to the fifth embodiment.
Figure 14B:
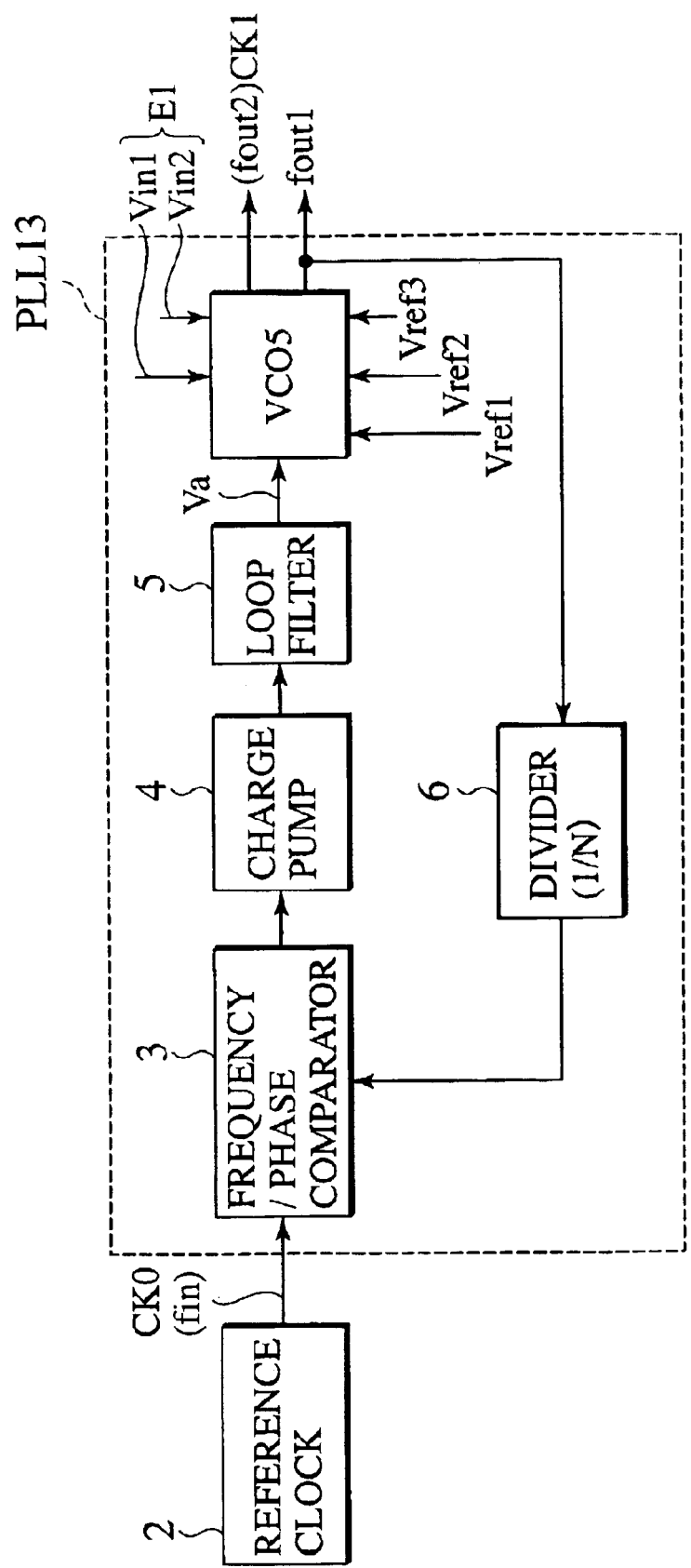
FIG. 14B is a block diagram of the PLL circuit according to the fifth embodiment.

As shown in FIGS. 14A, 14B, the PLL 13 of the fifth embodiment receives inputs of the input voltages Vin1, Vin2, the reference voltages Vref1, Vref2, Vref3 and the clock signal CK0 of the input frequency fin and outputs the clock signal CK1 of the output frequency fout2 and an oscillation signal of the output frequency fout1. The input voltages Vin1, Vin2 constitute the control signal E1.

The PLL 13 is composed of two blocks, that is, a referene side PLL circuit 21 and a VCO 32 for generating an oscillation signal of the intermediate frequency fcenter. The reference side PLL circuit 21 has a VCO 31.

The PLL 13 includes a voltage/current converting circuit 14 and a reference side PLL circuit 21 instead of the voltage/current converting circuit 12 in the VCO 3 of FIG. 10. The reference side PLL circuit 21 contains a phase locked loop (PLL) circuit. The PLL circuit on the reference side PLL circuit 21 includes the frequency phase comparator 3, the charge pump 4, the loop filter (low-pass filter) 5, the divider 6 and the VCO 31.

The VCO 31 includes the voltage/current converting circuits 12, 14, a reference current generator 19, the current control oscillation circuit 16 and an adder 23. The VCO 32 includes the voltage/current converting circuits 13, 7, a reference current generator 20, the current control oscillation circuit 15 and the adder 22. The voltage/current converting circuit 13 outputs an output current I3 proportional to a voltage difference between the control voltage Va and the reference voltage Vref3 to the current control oscillation circuit 15. The voltage/current converting circuit 7 outputs an output current I1 proportional to a voltage difference between the control voltage Vin1 and the reference voltage Vref1 to the current control oscillation circuit 15. The reference current generator 20 outputs the reference current Iref to the current control oscillation circuit 15. The current control oscillation circuit 15 receives an input of a sum of the output currents I3, I1 and Iref and outputs a signal of the oscillation frequency fout2.

The current control oscillation circuit 16 outputs an oscillation signal of the output frequency fout1 obtained by multiplying the control current Icnt0 with the gain Gico. The voltage/current converting circuit 14 adds the output current I3 obtained by multiplying a voltage difference between the control voltage Va and the reference voltage Vref3 with the gain gm3 to the control current Icnt0. The adder 23 sets the control current Icnt to a value of the sum of the output current I2, the reference current Iref and the output current I3. The plus (+) input terminals of the voltage/current converting circuits 13, 14 are connected to the output terminals Va of the loop filter. The reference voltage Vref3 is connected to the minus (−) input terminals of the voltage/current converting circuits 13, 14 in common. Thus, the output currents I3 of the voltage/current converting circuits 13, 14 are equal to each other.

By the locking operation of the PLL circuit, the control voltage Va, the output frequency fout1 and the output current I3 are made constant. The voltage/current converting circuit 12 adds the output current I2 obtained by multiplying a voltage difference between the control voltage Vin2 and the reference voltage Vref2 with the gain gm2 to the control current Icnt0. The reference current generator 19 adds the constant voltage Va to the control current Icnt0. The voltage/current converting circuit 13 adds the output current I3 obtained by multiplying a voltage difference between the control voltage Va and the reference voltage Vref3 with the gain gm3 to the control current Icnt. The frequency fout1 is an intermediate frequency of the output frequency fout2. Further, the divider 6 outputs a frequency obtained by dividing the frequency fout1 by N. The frequency phase comparator 3 obtains a difference between the output frequency fout1 divided by N and the reference frequency fin. The charge pump 4 outputs an output current proportional to this difference. The loop filter 5 outputs a control voltage Va proportional to an integrated value of this output current.

Next, the operation of the PLL 13 of the fifth embodiment will be described in detail. When the input voltage Vin2 is equal to the reference voltage Vref2 (Vin2=Vref2), when the reference side PLL circuit 21 is locked, the output oscillation frequency fout1 outputs the intermediate frequency fcenter as indicated by equation 16.

$$f_{out1} = f_{center} = N \times f_{in1} \quad (16)$$

At this time, the control voltage Va is inputted to the voltage/current converting circuit 13 of the VCO 32. When the input voltage Vin1 is equal to the reference voltage Vref1 (Vin1=Vref1), the input signal condition of the VCO 32 becomes just equal to that of the VCO 31, so that the output frequency fout2 outputs the intermediate frequency fcenter. When the Vin1 is changed from this state, the frequency characteristic having the oscillation frequency gain gm1 is produced.

The PLL 13 is capable of controlling the frequency of the output frequency fout2 according to the control voltage Vin2. Assume that the input voltage Va is locked at voltage Va1 (Va=Va1) when the input voltage Vin2 is equal to the reference voltage Vref2 (Vin2=Vref2). Here, when the input voltage Vin2 is changed by voltage ΔVin2 (Vin2=Vref2+ΔVin2), a current of −gm2×ΔVin2 flows into the current control oscillation circuit 16 so that the oscillation frequency fout1 is changed. However, the reference side PLL circuit 21 oscillates while controlling the control voltage Va so as to satisfy equation 16. Consequently, the voltage/current converting circuit 13 changes the input voltage Va by voltage ΔVa1 so as to cancel a current (−gm2×ΔVin2) of the voltage/current converting circuit 12. At this time, equation 17 is established between the input voltage changes ΔVa1 and ΔVin2 of the voltage/current converting circuits 14, 12 and this equation can be changed to equation 18.

$$gm_3 \times \Delta V_{a1} + (-gm_2) \times \Delta V_{in2} = 0 \quad (17)$$

$$\Delta V_{a1} = \frac{gm_2}{gm_3} \times \Delta V_{in2} \quad (18)$$

The input of the voltage/current converting circuit 13 of the VCO 31 is changed by only ΔVa1. When oscillation frequency to control current gains of the current control oscillation circuits 15, 16 are set to Gico, a change amount Δfout2 of the output frequency fout2 is expressed by equation 19 because of equation 18. Consequently, the output frequency fout2 has an oscillation frequency gain of Gico×gm2 to the input voltage Vin2.

$$\Delta f_{out2} = G_{ico} \times gm_3 \times \Delta V_{a1} \quad (19)$$
$$= G_{ico} \times gm_3 \times \left(\frac{gm_2}{gm_3} \times \Delta V_{in2}\right)$$
$$= G_{ico} \times gm_2 \times \Delta V_{in2}$$

From a result of equation 19, it is apparent that the PLL 13 is a modification of the VCO 3 of the third embodiment of FIG. 10. That is, the VCO 3 includes the voltage/current converting circuit 13 and a reference side PLL circuit 21 instead of the voltage/current converting circuit 12. The voltage/current converting circuit 13 and the reference side PLL circuit 21 have the same function as the voltage/current converting circuit 12 of the VCO 3.

The oscillation frequency fout2 is capable of controlling the oscillation frequency even from the input voltage Vin1. Supplying the current control oscillation circuit 15 with the current I1 proportional to the current gain gm1 of the voltage/current converting circuit 7 enables the output frequency fout2 to be controlled.

In conclusion, the output frequency fout2 is controlled independently by the input voltages Vin1, Vin2 and the oscillation frequency fout2 is expressed by equation 20.

$$f_{out2} = f_{center} + G_{ico} \times (gm_1 \Delta V_{in1} + gm_2 \Delta V_{in2}) \quad (20)$$
$$= N \times f_{in1} + G_{ico} gm_1 (V_{in1} - V_{ref}) + G_{ico} gm_2 (V_{in2} - V_{ref})$$

Equation 20 is equal to equation 15. Thus, it is apparent that the PLL 13 of FIG. 14A and the PLL 12 of FIG. 12A have the same oscillation frequency characteristic, which is expressed as indicated in FIG. 13.

Like the PLL 12, the PLL 13 increases the current gain gm2 and decreases the current gain gm1. Consequently, a large variable frequency range is secured by the current gain gm2. Further, because the current gain gm1 is small, the oscillation frequency gain (Gico×gm1) to a signal from the input voltage Vin1 is small, so that the PLL 13 is likely to be affected by disturbance.

When the value of the current gain gm2 is increased so as to expand the oscillation frequency range, the frequency gain (Gico×gm2) to the input voltage Vin2 is increased, and the PLL 12 is likely to be affected by disturbance. Thus, it is necessary to provide a protection from an influence of disturbance or noise by inserting a low-pass filter or the like in front of the input terminal of the input voltage Vin2.

On the other hand, even when the oscillation frequency range is expanded by increasing the value of the current gain gm2, the PLL 13 has an effect of suppressing an influence of disturbance or noise because the input portion of the voltage/current converting circuit 14 is connected to an output of the loop filter 5. Thus, a circuit occupying a large area, such as the low-pass filter, does not have to be added.

The reference current generator 20 inputs the reference current Iref into the current control oscillation circuit 15. When the maximum input voltage Vin2H is inputted to the voltage/current converting circuit 12 as the input voltage Vin2 as shown in FIG. 13(a) (Vin2=Vin2H), a line (1) in FIG. 13 is obtained. When the reference voltage Vref2 is inputted to the voltage/current converting circuit 12 as the input voltage Vin2 (Vin2=Vref2), a line (2) is obtained. When the minimum input voltage Vin2L is inputted to the voltage/current converting circuit 12 as the input voltage Vin2 (Vin2=Vin2L), a line (3) is obtained.

As shown in FIG. 13(a), the maximum input voltage Vin2H is inputted to the voltage/current converting circuit 12 as the input voltage Vin2. The maximum input voltage Vin1H is inputted to the voltage/current converting circuit 7 as the input voltage Vin1 as shown in FIG. 13(b). At this time, the maximum value fmax of the oscillation frequency fout2 is obtained. Likewise, when the minimum input voltage Vin21 is inputted to the voltage/current converting circuit 12 as the input voltage Vin2 and the minimum input voltage Vin1 is inputted to the voltage/current converting circuit 7 as the input voltage Vin1, the minimum value fmin of the output frequency fout2 is obtained.

The PLL 13 can be regarded as including the VCO 5. The PLL 13 includes the frequency phase comparator 3, the charge pump 4, the loop filter 5, the divider 6 and the VCO 5. As shown in FIGS. 14A, 14B, the VCO 5 receives inputs of the input voltages Vin1, Vin2, Va and the reference voltages Vref1, Vref2, Vref3 and outputs oscillation signals of the output oscillation frequencies fout1, fout2. The VCO 5 includes the voltage/current converting circuits 7, 12–14, the current control oscillation circuits 15, 16, the reference current generators 19, 20 and the adders 22, 23.

The PLL 13 is adaptable to the PLL1–PLL5 just as the PLL 12.

The circuits of the first-fifth embodiments are operated based on the power supply voltage VDD. Instead, it is permissible to constitute a circuit by replacing a p-channel MOS transistor with a n-channel MOS transistor from the viewpoint of the polarity of the transistor and actuate those circuits based on the grounding voltage GND. The same effect can be obtained in this way.

As described above, the present invention is capable of providing a VCO circuit which blocks influences of disturbance and has a wide oscillation frequency range.

The present invention may be embodied in other specific forms without departing from the spirit or essential characteristics thereof. The embodiments are therefore to be considered in all respects as illustrative and not restrictive, the scope of the present invention being indicated by the appended claims rather than by the foregoing description, and all changes which come within the meaning and range of equivalency of the claims are therefore intended to be embraced therein.

What is claimed is:

1. A voltage controlled oscillator comprising:
  a first current controlled oscillator configured to output an oscillation signal of a first frequency equal to a product of a first control current and a first gain;
  a first voltage/current converting circuit configured to output a first output current equal to a product of a second gain and a voltage difference between a first control voltage and a first reference voltage;
  a first reference current generator configured to output a constant current;
  a control current circuit configured to output a second variable output current; and
  an adder configured to set the first control current to a sum of the first output current, the constant current and the second variable output current.

2. The voltage controlled oscillator as claimed in claim 1, wherein the control current circuit comprises current sources configured to be turned on and off by an input signal and configured to output the second output current.

3. The voltage controlled oscillator as claimed in claim 1, wherein a current value of the second variable output current is equal to a product of a third gain and a voltage difference between a second control voltage and a second reference voltage.

4. The voltage controlled oscillator as claimed in claim 3, wherein the third gain is larger than the second gain.

5. The voltage controlled oscillator as claimed in claim 3, wherein the first reference current generator comprises a first phase locked loop circuit including a second voltage/current converting circuit configured to output a third output current equal to a product of a fourth gain and a voltage difference between a third control voltage and a third reference voltage, a second current control oscillation circuit configured to output an oscillation signal of a second frequency equal to a product of the third output current and the first gain, and a third voltage/current converting circuit configured to add the constant current equal to the third output current to the first control current, the first phase locked loop circuit maintaining the third control voltage and the second frequency constant.

6. The voltage controlled oscillator as claimed in claim 5, wherein the first phase locked loop circuit comprises:
  a divider configured to divide the second frequency;
  a frequency/phase comparator configured to receive a frequency difference of a reference frequency and the second frequency divided;
  a charge pump configured to output a fourth output current corresponding to the frequency difference; and
  a loop filter configured to output the third control voltage proportional to an integrated value of the fourth output current.

7. The voltage controlled oscillator as claimed in claim 3, wherein the control current circuit comprises:
  a second phase locked loop circuit including a third current control oscillation circuit configured to output an oscillation signal of a third frequency equal to a product of a second control current and the first gain, a fourth voltage/current converting circuit configured to add a fifth output current equal to a product of a fifth gain and a voltage difference between a fourth control voltage and a fourth reference voltage to the second control current, a fifth voltage/current converting circuit configured to add a sixth output current equal to a product of the third gain and a voltage difference between a fifth control voltage and a fifth reference voltage to the second control current, and a second reference current generator configured to add a current equal to the constant current to the second control current, the second phase locked loop circuit maintains the fourth control voltage and the third frequency constant; and
  a sixth voltage/current converting circuit configured to add the second variable output current equal to a product of the fifth gain and a voltage difference between the fourth control voltage and the fourth reference voltage to the first control current.

8. The voltage controlled oscillator as claimed in claim 7, wherein the second phase locked loop circuit comprises:
  a divider configured to divide the third frequency;
  a frequency/phase comparator configured to receive a frequency difference of a reference frequency and the third frequency divided;
  a charge pump configured to output a seventh output current corresponding to the frequency difference; and
  a loop filter configured to output the fourth control voltage proportional to an integrated value of the seventh output current.

9. A phase locked loop circuit configured to input a clock signal having a reference frequency, comprising:
  a first current controlled oscillator configured to output an oscillation signal of a first frequency equal to a product of a first control current and a first gain;
  a first voltage/current converting circuit configured to output a first output current equal to a product of a second gain and a voltage difference between a first control voltage and a first reference voltage;
  a first reference current generator configured to output a constant current;
  a control current circuit configured to output a second variable output current;

an adder configured to set the first control current to a sum of the first output current, the constant current and the second variable output current;

a divider configured to divide the first frequency;

a frequency/phase comparator configured to receive a frequency difference of the reference frequency and the first divided frequency;

a charge pump configured to output a third output current corresponding to the frequency difference; and a loop filter configured to output the first control voltage proportional to an integrated value of the third output current.

10. The phase locked loop circuit as claimed in claim 9, wherein the control current circuit comprises current sources configured to be turned on and off by an input signal and configured to output the second variable output current.

11. The phase locked loop circuit as claimed in claim 9, wherein a current value of the second variable output current is equal to a product of a third gain and a voltage difference between a second control voltage and a second reference voltage.

12. The phase locked loop circuit as claimed in claim 11, wherein the third gain is larger than the second gain.

13. A phase locked loop circuit configured to input a clock signal having a reference frequency, comprising:

a first current controlled oscillator configured to output an oscillation signal of a first frequency equal to a product of a first control current and a first gain;

a first voltage/current converting circuit configured to add a first output current equal to a product of a second gain and a voltage difference between a first control voltage and a first reference voltage to the first control current;

a second voltage/current converting circuit configured to output a second variable output current equal to a product of a voltage difference between a second control voltage and a first reference voltage and a third gain larger than the second gain;

a second current controlled oscillator configured to output an oscillation signal of a second frequency equal to a product of a second control current and the first gain;

a third voltage/current converting circuit configured to add a third output current equal to a product of a fourth gain and a voltage difference between a third control voltage and a third reference voltage to the second control current;

a fourth voltage/current converting circuit configured to add a fourth output current equal to a product of the fourth gain and a voltage difference between the third control voltage and the third reference voltage to the first control current;

a divider configured to divide the second frequency;

a frequency/phase comparator configured to receive a frequency difference between the second frequency divided and the reference frequency;

a charge pump configured to output a fifth output current corresponding to the frequency difference; and a loop filter configured to output the third control voltage proportional to an integrated value of the fifth output current.

14. The phase locked loop circuit as claimed in claim 13, wherein the second variable output current is added to the first control current.

15. The phase locked loop circuit as claimed in claim 13, wherein the second variable output current is added to the second control current.

16. The phase locked loop circuit as claimed in claim 13, further comprising:

a first reference current generator configured to add a constant current to the first control current; and a second reference current generator configured to add a current equal to the constant current to the second control current.

* * * * *